(12) United States Patent
Oikawa et al.

(10) Patent No.: US 12,100,587 B2
(45) Date of Patent: Sep. 24, 2024

(54) SUBSTRATE CLEANING APPARATUS AND CLEANING METHOD OF SUBSTRATE

(71) Applicant: EBARA CORPORATION, Tokyo (JP)

(72) Inventors: Fumitoshi Oikawa, Tokyo (JP); Tomoaki Fujimoto, Tokyo (JP); Mitsuru Miyazaki, Tokyo (JP); Koichi Fukaya, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 358 days.

(21) Appl. No.: 17/068,114

(22) Filed: Oct. 12, 2020

(65) Prior Publication Data
US 2021/0111018 A1 Apr. 15, 2021

(30) Foreign Application Priority Data
Oct. 15, 2019 (JP) .................. 2019-188424

(51) Int. Cl.
*H01L 21/02* (2006.01)
*B08B 1/32* (2024.01)
(Continued)

(52) U.S. Cl.
CPC .......... *H01L 21/02087* (2013.01); *B08B 1/32* (2024.01); *B08B 3/102* (2013.01); *B08B 13/00* (2013.01); *H01L 21/67017* (2013.01)

(58) Field of Classification Search
CPC ......... H01L 21/02087; H01L 21/67017; H01L 21/67046; H01L 21/67051;
(Continued)

(56) References Cited

U.S. PATENT DOCUMENTS 5,937,469 A * 8/1999 Culkins ............. H01L 21/67046
15/179
6,092,253 A * 7/2000 Moinpour ......... H01L 21/67046
15/21.1
(Continued)

FOREIGN PATENT DOCUMENTS

JP H06-045302 A 2/1994
JP H10-125640 A 5/1998
(Continued)

OTHER PUBLICATIONS

Machine translation of JP-2011103394-A (Year: 2011).*

*Primary Examiner* — David G Cormier
*Assistant Examiner* — Thomas Bucci
(74) *Attorney, Agent, or Firm* — PEARNE & GORDON LLP

(57) ABSTRACT

A substrate cleaning apparatus has: a substrate rotating part that rotates a substrate; an edge cleaning member for cleaning an edge part of the substrate; an edge rotating part that rotates the edge cleaning member around an edge rotary shaft that extends in a direction orthogonal to a substrate rotary shaft; a moving part that moves a position of the edge cleaning member with respect to the edge part of the substrate; and a control part that controls the moving part to move the position of the edge cleaning member with respect to the edge part of the substrate, and causes the edge cleaning member to clean a one-side edge area including a face on one side, a side face area including a side face, and an another-side edge area including a face on another side in the edge part of the substrate.

18 Claims, 22 Drawing Sheets

(51) Int. Cl.
  *B08B 3/10* (2006.01)
  *B08B 13/00* (2006.01)
  *H01L 21/67* (2006.01)

(58) Field of Classification Search
  CPC ..... H01L 21/68764; B08B 1/04; B08B 3/102;
         B08B 7/04; B08B 13/00; B08B 1/001;
         B08B 3/02
  USPC .......................................................... 134/151
  See application file for complete search history.

(56) References Cited

U.S. PATENT DOCUMENTS

| | | | |
|---|---|---|---|
| 6,439,245 B1* | 8/2002 | Bliven | H01L 21/67706 134/32 |
| 6,851,152 B2 | 2/2005 | Sotozaki et al. | |
| 2002/0022445 A1 | 2/2002 | Sotozaki et al. | |
| 2004/0035450 A1* | 2/2004 | Ko | B24C 1/003 257/E21.228 |
| 2005/0172430 A1* | 8/2005 | Yudovsky | B08B 1/32 134/6 |
| 2006/0291855 A1* | 12/2006 | Shigemori | H01L 21/67051 396/611 |
| 2007/0226924 A1* | 10/2007 | Hiraoka | B08B 1/32 15/88.2 |
| 2007/0226925 A1* | 10/2007 | Hiraoka | B08B 1/32 15/88.2 |
| 2008/0263793 A1* | 10/2008 | Nakano | H01L 21/67046 15/77 |
| 2009/0050177 A1* | 2/2009 | Nagayasu | H01L 21/02087 134/104.1 |
| 2009/0084403 A1 | 4/2009 | Shindo | |
| 2009/0113656 A1 | 5/2009 | Yoon et al. | |
| 2010/0224964 A1 | 9/2010 | Passek et al. | |
| 2014/0187126 A1* | 7/2014 | Nakanishi | H01L 21/02057 451/66 |
| 2015/0162181 A1* | 6/2015 | Yamashita | H01L 21/02021 438/691 |
| 2015/0235858 A1* | 8/2015 | Lee | B24B 7/228 438/693 |
| 2018/0294171 A1 | 10/2018 | Minoshima et al. | |
| 2020/0066510 A1 | 2/2020 | Yamamoto et al. | |

FOREIGN PATENT DOCUMENTS

| | | |
|---|---|---|
| JP | H10-261605 A | 9/1998 |
| JP | 2000-241794 A | 9/2000 |
| JP | 2001-212528 A | 8/2001 |
| JP | 2002-052370 A | 2/2002 |
| JP | 2006-278592 A | 10/2006 |
| JP | 2007-273608 A | 10/2007 |
| JP | 2008-084934 A | 4/2008 |
| JP | 2008-277518 A | 11/2008 |
| JP | 2009-088244 A | 4/2009 |
| JP | 2009-536457 A | 10/2009 |
| JP | 2010-254550 A | 11/2010 |
| JP | 2011103394 A * | 5/2011 |
| JP | 2018-113393 A | 7/2018 |
| JP | 2020-031181 A | 2/2020 |
| JP | 2020-043157 A | 3/2020 |

\* cited by examiner

SUBSTRATE CLEANING APPARATUS AND CLEANING METHOD OF SUBSTRATE

BACKGROUND

Technical Field

The present invention relates to a substrate cleaning apparatus for cleaning an edge part of a substrate and cleaning method of the edge part of the substrate.

The present application claims the priority of Japanese Patent Application No. 2019-188424 filed on Oct. 15, 2019, the contents of which are entirely incorporated by reference.

Related Art

Conventionally, there has been a problem in which an edge part of a substrate fails to be effectively cleaned and this results in re-adhesion on a surface of the substrate of particles that have not been cleaned and remain in the edge part of the substrate in some cases. In order to solve such a problem, an edge part of a substrate that is made of a semiconductor wafer or the like is cleaned. JP 2002-052370 A has proposed a substrate cleaning apparatus that has a plurality of substrate rotating rollers that holds an edge part of a substrate and rotates the substrate, a cleaning roller that is rotatable, and has a cleaning member that comes into contact with an end face and a bevel face of the substrate and scrubs and cleans the end face and the bevel face, and a power transmission mechanism that transmits the power of the substrate rotating roller to the cleaning roller, and rotates the cleaning roller.

SUMMARY

In the aspect disclosed in JP 2000-241794 A, the edge part of the substrate can be cleaned, but a cleaning effect is not sufficient.

The present invention provides a substrate cleaning apparatus and a substrate cleaning method that enable an edge part of a substrate to be more reliably cleaned.

[Concept 1]
A substrate cleaning apparatus may comprise:
a substrate rotating part that rotates a substrate;
an edge cleaning member for cleaning an edge part of the substrate;
an edge rotating part that rotates the edge cleaning member around an edge rotary shaft that extends in a direction orthogonal to a substrate rotary shaft;
a moving part that moves a position of the edge cleaning member with respect to the edge part of the substrate; and
a control part that controls the moving part to move the position of the edge cleaning member with respect to the edge part of the substrate, and causes the edge cleaning member to clean a one-side edge area including a face on one side, a side face area including a side face, and an another-side edge area including a face on another side in the edge part of the substrate.

[Concept 2]
In the substrate cleaning apparatus according to concept 1,
the control part may control in such a way that the edge cleaning member cleans the one-side edge area during a predetermined time period, then the edge cleaning member cleans the side face area during a predetermined time period, and then the edge cleaning member cleans the another-side edge area during a predetermined time period; or the control part controls in such a way that the edge cleaning member cleans the another-side edge area during a predetermined time period, then the edge cleaning member cleans the side face area during a predetermined time period, and then the edge cleaning member cleans the one-side edge area during a predetermined time period.

[Concept 3]
The substrate cleaning apparatus, according to concept 1 or 2, may further comprise a detecting part that detects a force applied to the edge cleaning member, wherein
the control part may control the moving part based on a detection result by the detecting part in such a way that a force to be applied to the edge cleaning member at a time when the edge cleaning member cleans the one-side edge area or the another-side edge area is different from a force to be applied to the edge cleaning member at a time when the edge cleaning member cleans the side face area.

[Concept 4]
In the substrate cleaning apparatus according to concept 3,
the control part may control in such a way that the force to be applied to the edge cleaning member at the time when the edge cleaning member cleans the one-side edge area is substantially the same as the force to be applied to the edge cleaning member at the time when the edge cleaning member cleans the another-side edge area.

[Concept 5]
In the substrate cleaning apparatus according to concept 3 or 4,
the control part may control in such a way that the force to be applied to the edge cleaning member at the time when the edge cleaning member cleans the one-side edge area and the force to be applied to the edge cleaning member at the time when the edge cleaning member cleans the another-side edge area are greater than the force to be applied to the edge cleaning member at the time when the edge cleaning member cleans the side face area.

[Concept 6]
A substrate cleaning apparatus may comprise:
a substrate rotating part that rotates a substrate;
an edge cleaning member for cleaning an edge part of the substrate; and
an edge rotating part that rotates the edge cleaning member around an edge rotary shaft that extends in a direction orthogonal to a substrate rotary shaft, wherein
the edge cleaning member may have a first edge cleaning member that abuts onto and cleans at least a part of one side of a side face and a face on the one side in the edge part of the substrate, and a second edge cleaning member that abuts onto and cleans at least a part of another side of the side face and a face on another side in the edge part of the substrate; or the edge cleaning member has a third edge cleaning member that abuts onto and cleans at least a side face of the substrate, a fourth edge cleaning member that abuts onto and cleans at least a face on one side in the edge part of the substrate, and a fifth edge cleaning member that abuts onto and cleans at least a face on another side in the edge part of the substrate.

[Concept 7]
A substrate cleaning apparatus may comprise:
a substrate rotating part that rotates a substrate;

a substrate cleaning liquid supplying part that supplies cleaning liquid to the substrate;

an edge cleaning member for cleaning an edge part of the substrate;

an edge rotating part that rotates the edge cleaning member around an edge rotary shaft that extends in a direction orthogonal to a substrate rotary shaft; and a control part that controls to separate the edge cleaning member from the edge part of the substrate, and then stop a rotation of the substrate by the substrate rotating part.

[Concept 8]

In the substrate cleaning apparatus according to concept 7, the control part may control to stop a supply of cleaning liquid from the substrate cleaning liquid supplying part after the edge cleaning member is separated from the edge part of the substrate and before the rotation of the substrate by the substrate rotating part is stopped.

[Concept 9]

In the substrate cleaning apparatus according to concept 7 or 8, the control part may control to stop the rotation of the edge cleaning member by the edge rotating part before the edge cleaning member is separated from the edge part of the substrate.

[Concept 10]

In the substrate cleaning apparatus according to any one of concepts 1 to 9, the substrate may be a wafer, and the edge cleaning member may have a shape in which a side face is curved in accordance with a shape of the wafer.

[Concept 11]

The substrate cleaning apparatus, according to any one of concepts 1 to 10, may further comprise an edge cleaning liquid supplying part that supplies cleaning liquid to a contact portion between the edge cleaning member and the substrate in a direction toward the edge part from a center part of the substrate.

[Concept 12]

In the substrate cleaning apparatus according to any one of concepts 1 to 11, a bulkhead may be provided on a center side of the substrate with respect to the edge cleaning member.

[Concept 13]

The substrate cleaning apparatus, according to concept 12, may further comprise a cover member having the bulkhead, wherein the cover member may cover the edge cleaning member.

[Concept 14]

The substrate cleaning apparatus, according to concept 13, may further comprise an edge cleaning liquid supplying part that supplies cleaning liquid to a contact portion between the edge cleaning member and the substrate in a direction toward the edge part from a center part of the substrate, wherein an attachment part that may be used to attach the edge cleaning liquid supplying part to the cover member.

[Concept 15]

The substrate cleaning apparatus, according to concept 13 or 14, may further comprise an edge cleaning liquid supplying part that supplies cleaning liquid to a contact portion between the edge cleaning member and the substrate in a direction toward the edge part from a center part of the substrate, wherein a discharge outlet that discharges cleaning liquid supplied from the edge cleaning liquid supplying part may be provided at the cover member.

[Concept 16]

The substrate cleaning apparatus, according to any one of concepts 1 to 15, may further comprise an edge cleaning mechanism that cleans the edge cleaning member.

[Concept 17]

In the substrate cleaning apparatus according to concept 16, the edge cleaning mechanism may have any one of a contact member that can abut onto the edge cleaning member, a cleaning liquid supplying member that supplies cleaning liquid to the edge cleaning member, and a suction member that sucks the edge cleaning member.

[Concept 18]

In the substrate cleaning apparatus according to concept 16 or 17, the control part may control in such a way that the edge cleaning mechanism cleans the edge cleaning member during a time period in which the edge cleaning member does not clean the edge part of the substrate.

[Concept 19]

In the substrate cleaning apparatus according to concept 16 or 17, the control part may control in such a way that the edge cleaning member cleans the edge part of the substrate at least partially overlaps a time period during which the edge cleaning mechanism cleans the edge cleaning member.

[Concept 20]

The substrate cleaning apparatus, according to any one of concepts 1 to 19, may comprise a pen unit that is rotated by the edge rotating part, wherein the edge cleaning member may be provided at a distal end of the pen unit.

[Concept 21]

The substrate cleaning apparatus, according to any one of concepts 1 to 20, may comprise a substrate cleaning member that abuts onto and cleans a face on one side or a face on another side of the substrate, wherein the control part may control in such a way that a time period during which the substrate cleaning member cleans the face on the one side or the face on the another side of the substrate at least partially overlaps a time period during which the edge cleaning member cleans the edge part of the substrate.

[Concept 22]

A cleaning method of substrate may comprise:

a step of rotating a substrate by a substrate rotating part; and a step of cleaning an edge part of the substrate by an edge cleaning member rotated around an edge rotary shaft that extends in a direction orthogonal to a substrate rotary shaft, wherein a position of the edge cleaning member with respect to the edge part of the substrate may be moved by a moving part, and a one-side edge area including a face on one side, a side face area including a side face, and an another-side edge area including a face on another side in the edge part of the substrate is cleaned by the edge cleaning member.

[Concept 23]

A cleaning method of substrate may comprise:

a step of rotating a substrate by a substrate rotating part;

a step of supplying cleaning liquid to the substrate by a substrate cleaning liquid supplying part; and a step of cleaning an edge part of the substrate by an edge cleaning member rotated around an edge rotary shaft that extends in a direction orthogonal to a substrate rotary shaft, wherein the edge cleaning member may be separated from the edge part of the substrate, and then the rotation of the substrate by the substrate rotating part is stopped.

In accordance with the present invention, a substrate cleaning apparatus and a substrate cleaning method that enable an edge part of a substrate to be more reliably cleaned can be provided.

DETAILED DESCRIPTION

First Embodiment

<<Configuration>>

An embodiment of a substrate processing apparatus including a substrate cleaning apparatus and the like will be described. A substrate cleaning method that uses the substrate cleaning apparatus according to the present embodiment, a program that is installed to generate the substrate cleaning apparatus, and a storage medium that stores the program and is made of a USB, a DVD, or the like are also provided according to the present embodiment.

Figure 1:
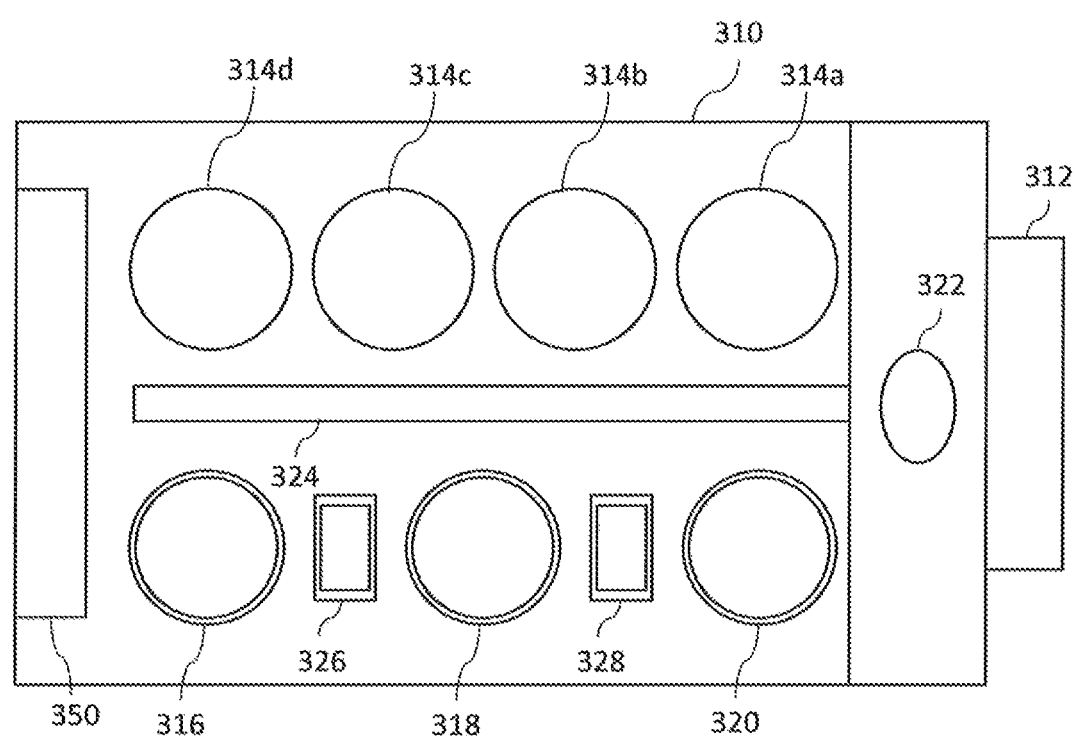
FIG. 1 is a schematic plan view illustrating an entire configuration of a processing apparatus that includes a substrate processing apparatus according to a first embodiment of the present invention.

As shown in FIG. 1, the substrate processing apparatus, according to the present embodiment, has a roughly rectangular housing 310 and a load port 312; a substrate cassette that stocks a number of substrates W is put on the load port 312. The load port 312 is placed adjacent to the housing 310. The load port 312 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 310, a plurality of (in an aspect shown in FIG. 1, four) polishing units 314a to 314d, first and second cleaning units 316 and 318 for cleaning a polished substrate W, and a drying unit 320 for drying the cleaned substrate W is contained. The polishing units 314a to 314d are arranged along a long side of the substrate processing apparatus, and the cleaning units 316 and 318 and the drying unit 320 are also arranged along the long side of the substrate processing apparatus. The substrate processing apparatus according to the present embodiment can polish various substrates W in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM). The substrate processing apparatus according to another embodiment may be configured to clean and dry a substrate W without a polishing unit for polishing the substrate W inside the housing 310.

In an area surrounded by the load port 312, and the polishing unit 314a and the drying unit 320 that are located on the side of the load port 312, a first transfer robot 322 is placed. Furthermore, a conveyance unit 324 is placed parallel to the polishing units 314a to 314d as well as the cleaning units 316 and 318 and the drying unit 320. The first transfer robot 322 receives a pre-polished substrate W from the load port 312 and transfers the substrate W to the conveyance unit 324, or receives a dried substrate W from the drying unit 320 and return the dried substrate W to the load port 312.

A second transfer robot 326 for transferring a substrate W between the first cleaning unit 316 and the second cleaning unit 318 is placed between the first cleaning unit 316 and the second cleaning unit 318, and a third conveyance unit 328 for transferring the substrate W between the second cleaning unit 318 and the drying unit 320 is placed between the second cleaning unit 318 and the drying unit 320. Furthermore, inside the housing 310, an entire control part 350, included in a control part, for controlling the operation of each device of the substrate processing apparatus is placed. In the present embodiment, there is described the aspect in which the entire control part 350 is placed inside the housing 310; however, the placement of the entire control part 350 is not limited to this, and the entire control part 350 may be placed outside the housing 310, and the entire control part 350 may be provided at a remote place.

A roll cleaning apparatus for scrubbing a surface of a substrate W while rotating around the center axis parallel with the substrate W by bringing the roll cleaning members linearly extending almost along the full diameter of the substrate W into contact with cleaning liquid may be used for the first cleaning unit 316. For example, the roll cleaning members may be brought into contact with a substrate W to clean the substrate W while the substrate W is horizontally or vertically held or held in an inclined direction against horizontal direction, and the substrate W is being rotated. A pencil cleaning apparatus for scrubbing a surface of a substrate W by bringing the contact faces of the vertically-extending columnar pencil cleaning members into contact with cleaning liquid and moving the pencil cleaning members in one direction while rotating may be used for the second cleaning unit 318. A spin drying unit for drying a substrate W by injecting IPA steam from a moving injection nozzle toward the horizontally-held and rotating substrate W and drying the substrate W by centrifugal force by faster rotating the substrate W may be used for the drying unit 320.

The first cleaning unit 316 may use not a roll cleaning apparatus, but a pencil cleaning apparatus similar to the second cleaning unit 318 or a two-fluid jet cleaning apparatus for cleaning a surface of a substrate W by two-fluid jet. Further, the second cleaning unit 318 may use not a pencil cleaning apparatus, but a roll cleaning apparatus similar to the first cleaning unit 316, or a two-fluid jet cleaning apparatus for cleaning a surface of a substrate W by two-fluid jet.

The cleaning liquid in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. In the present embodiment, unless otherwise specified, cleaning liquid means either rinse liquid, chemical liquid or the both rinse liquid and chemical liquid.

In the present embodiment, description is provided by providing a substrate W to extend in a horizontal direction, using an "upper side" as "one side", and using a "lower side" as "another side", but this is not restrictive. The substrate W may be provided to extend in a vertical direction, or may be provided to extend in an oblique direction between the horizontal direction and the vertical direction.

Figure 2A:
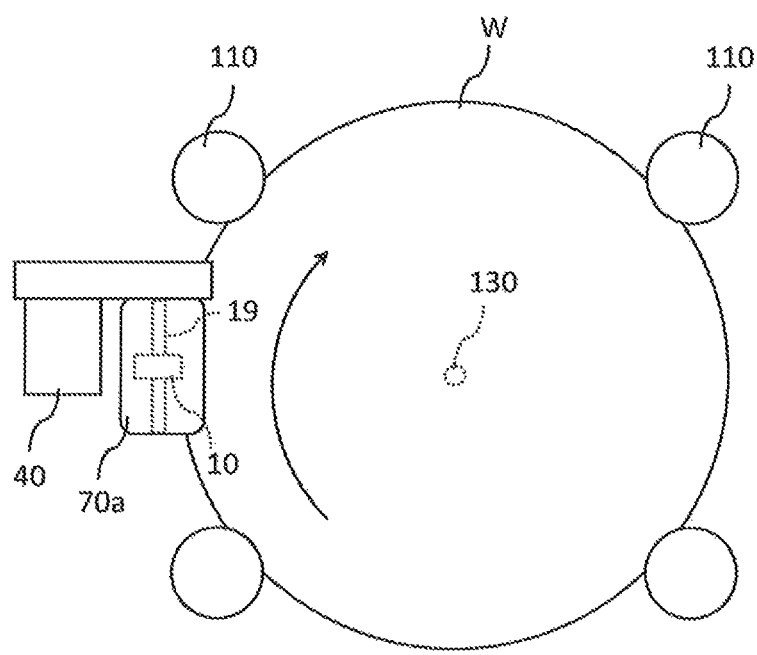
FIG. 2A is a plan view illustrating an edge cleaning member and the like that can be used in the first embodiment of the present invention.
Figure 2B:
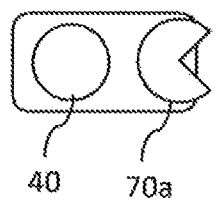
FIG. 2B is a side view illustrating a cover member that covers the edge cleaning member, and an edge rotating part that rotates the edge cleaning member.
Figure 3:
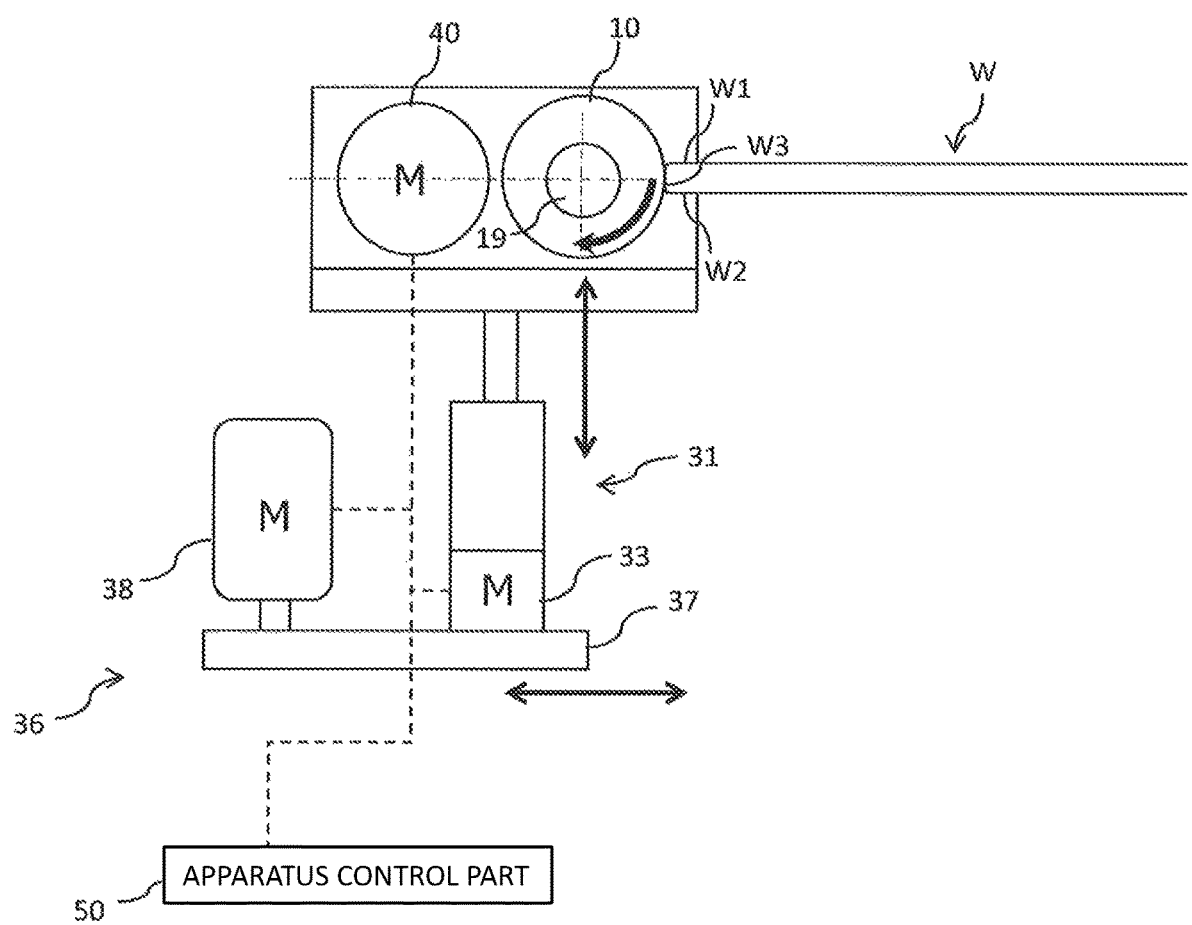
FIG. 3 is a side view illustrating an edge cleaning member, a first moving part, a second moving part, an edge rotating part, and the like that can be used in an embodiment of the present invention, and is a side view illustrating an aspect in which the edge cleaning member is cleaning a side face of a substrate, and it is noted that FIG. 3 does not illustrate a cover member.

As illustrated in FIGS. 2A and 2B, a substrate cleaning apparatus according to the present embodiment may have a substrate rotating part 110 that supports and rotates the substrate W, and is made of a spindle or the like, an edge cleaning member 10 that cleans an edge part of the substrate W, and an edge rotating part 40 that has a motor or the like that rotates the edge cleaning member 10 around an edge rotary shaft 19 that extends in a direction that is orthogonal to a substrate rotary shaft 130 (a direction that is parallel to an in-plane direction of the substrate W). As illustrated in FIG. 3, the substrate cleaning apparatus may have moving parts 31 and 36 that move a position of the edge cleaning member 10 with respect to the edge part of the substrate W. The moving parts 31 and 36 may have a first moving part 31 that moves the edge cleaning member 10 in a normal direction of the substrate W (an upward or downward direction in FIG. 3), and a second moving part 36 that moves the edge cleaning member 10 in the in-plane direction of the substrate W (a leftward or rightward direction in FIG. 3) to bring the edge cleaning member 10 close to the edge part of the substrate W or separate the edge cleaning member 10 from the edge part of the substrate W. Note that a supporting part that supports the substrate W and a rotating part that rotates the substrate W may be separately provided, the substrate W may be supported (held) by the supporting part such as a chuck, and the substrate W may be rotated by the rotating part. In this case, both the supporting part and the rotating part configure a substrate rotating part. In the substrate rotating part 110, a material of a supporting member that supports the substrates W is hard, and may be urethane or the like.

The second moving part 36 may have a base plate 37, and a second motor 38 that moves the base plate 37 in the in-plane direction of the substrate W. As the first moving part 31, an electric cylinder may be adopted that is fixed to the base plate 37 and has a first motor 33. As the edge cleaning member 10, sponge that is made of polyvinyl alcohol (PVA) or the like may be adopted, and in this case, the edge cleaning member 10 is configured by bevel sponge. The edge cleaning member 10 may be made of the same material as a material of a roll cleaning member. Note that the edge cleaning member 10 according to the present embodiment does not polish the edge part (a bevel) of the substrate W, but cleans the edge part of the substrate W.

The edge part of the substrate W means an area within a range of 1/10 of the length in the in-plane direction from an end part of the substrate W. In a case where the substrate W is made of a circular wafer and in a case where the diameter of the wafer is R, an area within a range of 1/10×R from the end part of the wafer is the edge part of the wafer. In the present embodiment, an aspect is employed in which part of the edge part of the substrate W rather than the entirety of the edge part is cleaned by the edge cleaning member 10. However, such an aspect is not restrictive, and the edge cleaning member 10 may clean the entirety of the edge part of the substrate W.

Figure 4:
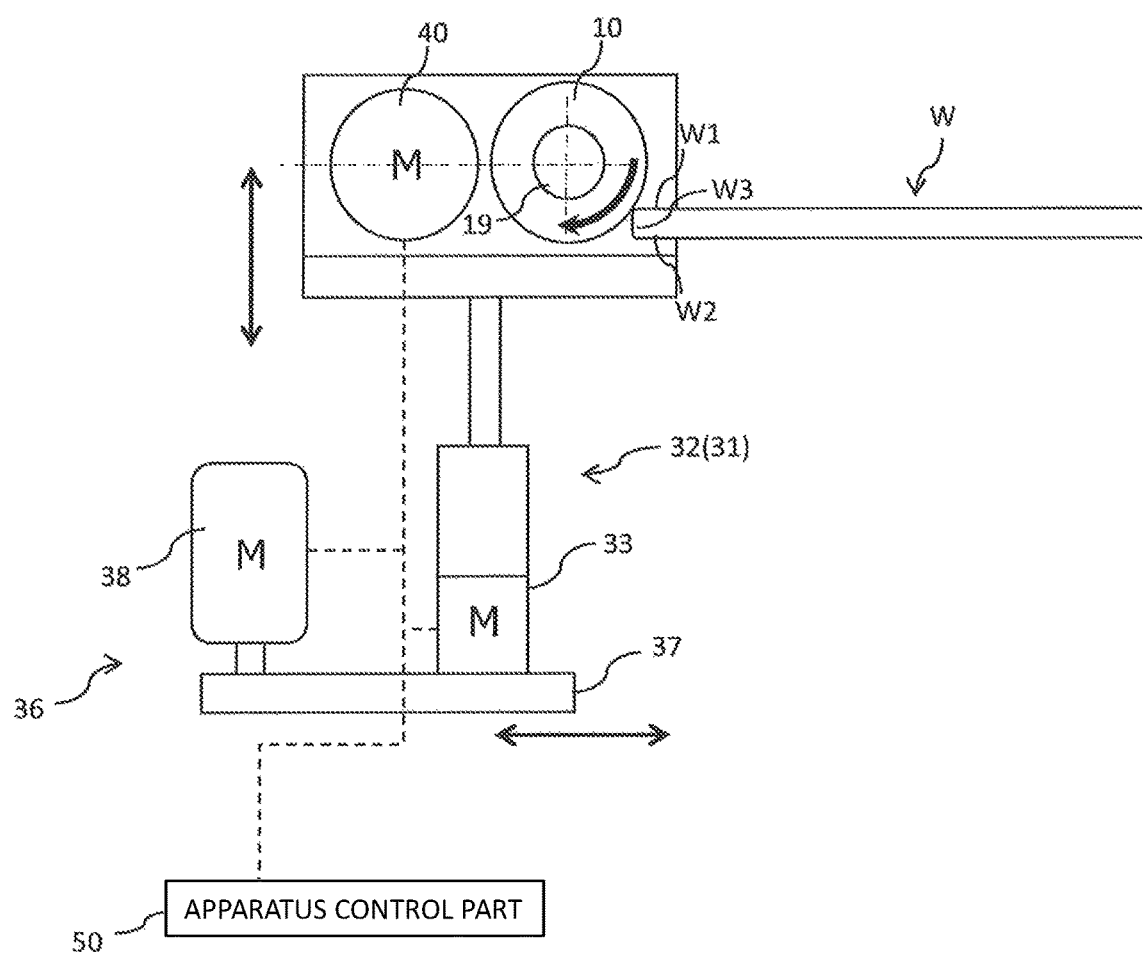
FIG. 4 is a diagram that corresponds to FIG. 3, and is a side view illustrating an aspect in which the edge cleaning member is cleaning a one-side edge area of an edge part of the substrate.
Figure 5:
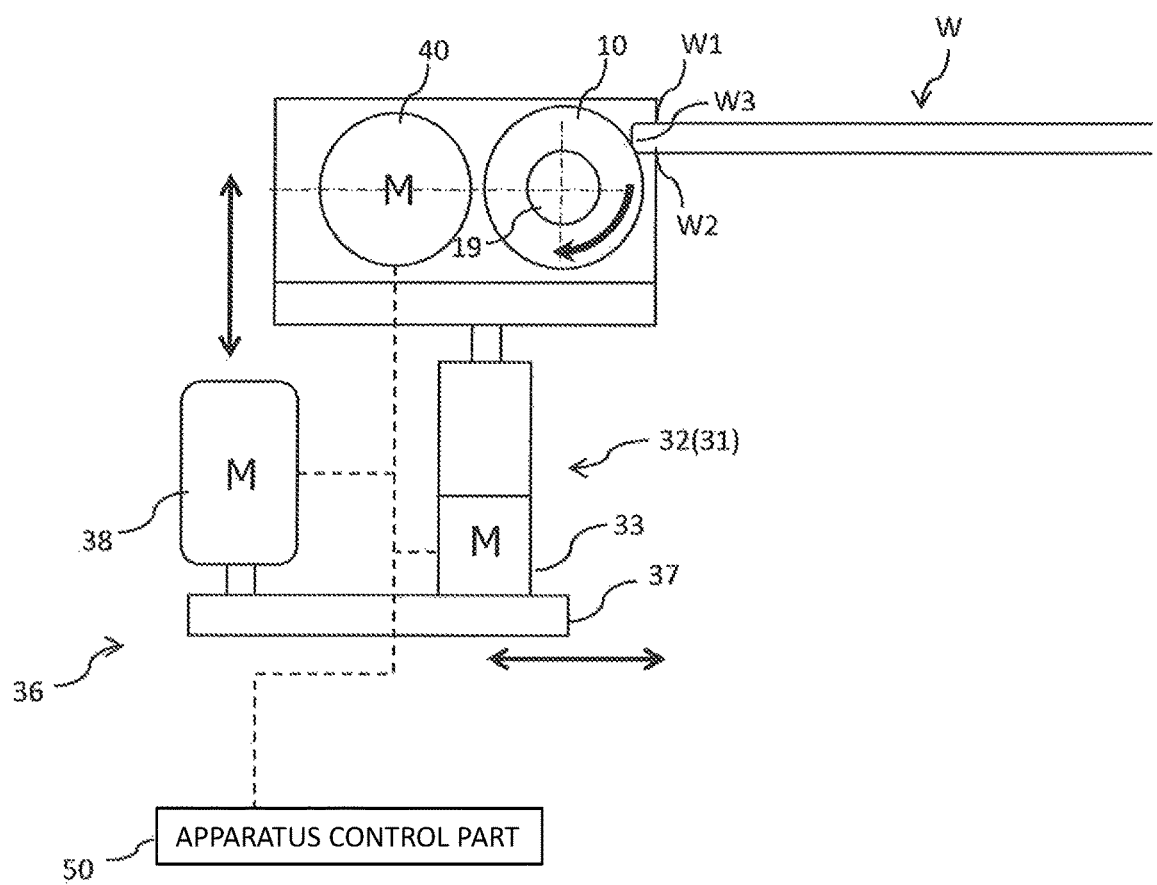
FIG. 5 is a diagram that corresponds to FIG. 3, and is a side view illustrating an aspect in which the edge cleaning member is cleaning an another-side edge area of the edge part of the substrate.

An apparatus control part 50 may be provided, and the apparatus control part 50 controls the first moving part 31 and the second moving part 36 to move a position of the edge cleaning member 10 with respect to the edge part of the substrate W, and causes the edge cleaning member 10 to clean a one-side edge area W1 including a face on one side, a side face area W3 including a side face, and an another-side edge area W2 including a face on another side in the edge part of the substrate W (see FIGS. 3 to 5). The substrate cleaning apparatus according to the present embodiment may be used in a first cleaning unit 316, may be used in a second cleaning unit 318, or may be used in a unit that is different from the first cleaning unit 316 and the second cleaning unit 318. The edge cleaning member 10 may have a columnar shape.

A speed and a direction at which or in which the edge rotating part 40 rotates the edge cleaning member 10 may be freely controllable by the apparatus control part 50.

In the present embodiment, description is provided by using an aspect in which the apparatus control part 50 controls the substrate cleaning apparatus, but this is not restrictive, and an entire control part 350 may control the substrate cleaning apparatus.

The apparatus control part 50 may perform control to sequentially clean the one-side edge area W1, the side face area W3, and the another-side edge area W2. More specifically, the apparatus control part 50 may perform control in such a way that the edge cleaning member 10 cleans the one-side edge area W1 during a predetermined first time period T1, the edge cleaning member 10 cleans the side face area W3 during a predetermined third time period T3, and then the edge cleaning member 10 cleans the another-side edge area W2 during a predetermined second time period T2. Alternatively, the apparatus control part 50 may perform control in such a way that the edge cleaning member 10 cleans the another-side edge area W2 during the predetermined second time period T2, the edge cleaning member 10 cleans the side face area W3 during the predetermined third time period T3, and then the edge cleaning member 10 cleans the one-side edge area W1 during the predetermined first time period T1. The first time period T1, the second time period T2, and the third time period T3 may be the same or substantially the same as each other, or may be different from each other. In the present embodiment, "substantially the same" means that a difference between both is 5% or less of the greater of both. Accordingly, the first time period T1, the second time period T2, and the third time period T3 being substantially the same as each other means, for example, that T1−T2≤T1×0.05 and T1−T3≤T1×0.05 in a case where T1 is greater than T2 and T3. Note that the first time period T1, the second time period, T2, and the third time period T3 may be, for example, several seconds, several minutes, or a time period of 30 minutes or longer.

Figure 9:
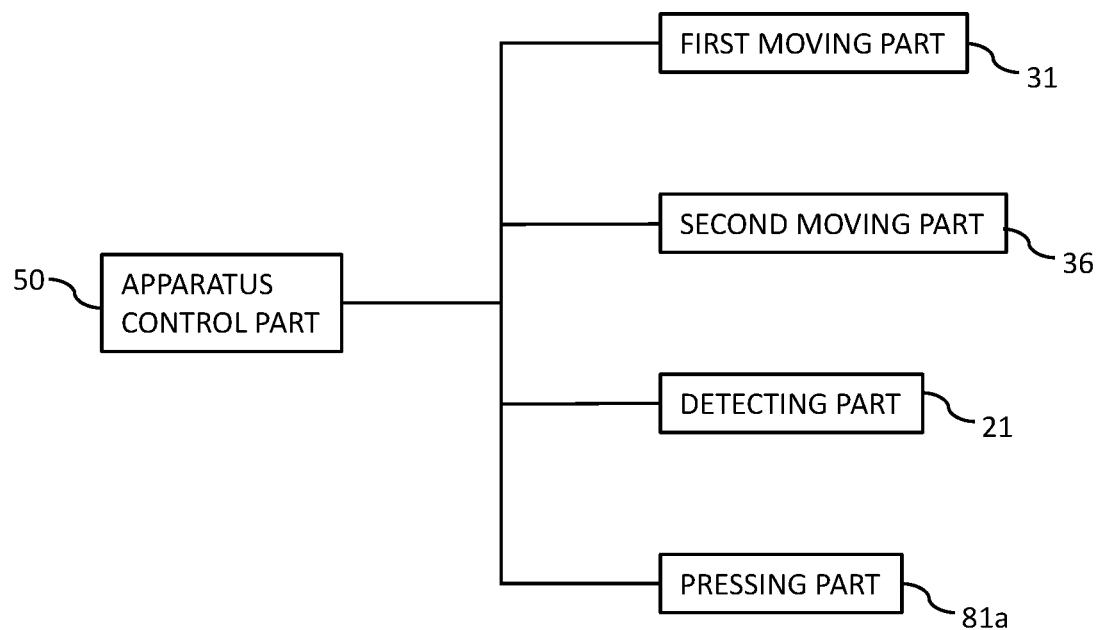
FIG. 9 is a block diagram illustrating components that can be used in a substrate cleaning apparatus that can be used in the first embodiment of the present invention.

A detecting part 21 that detects a force applied to the edge cleaning member 10 may be provided (see FIG. 9). The detecting part 21 may be provided in the edge rotary shaft 19 of the edge cleaning member 10, or may be configured to detect a force that is applied to the edge cleaning member 10 by detecting a force that is applied to the second moving part 36 or forces that are applied to the first moving part 31 and the second moving part 36. The detecting part 21 may directly detect an applied force, or may detect a force that is applied due to torque that is applied to a motor that presses the edge cleaning member 10 against the substrate W. The apparatus control part 50 may perform feedback control by using a detection result by the detecting part 21 in such a way that a force to be applied to the substrate W becomes constant.

The apparatus control part 50 may control the second moving part 36, or the first moving part 31 and the second moving part 36 on the basis of a detection result by the detecting part 21 in such a way that a force to be applied to the edge cleaning member 10 at a time when the edge cleaning member 10 cleans the one-side edge area W1 or the another-side edge area W2 is different from a force to be applied to the edge cleaning member 10 at a time when the edge cleaning member 10 cleans the side face area W3.

The apparatus control part 50 may perform control in such a way that a force to be applied to the edge cleaning member 10 at a time when the edge cleaning member 10 cleans the one-side edge area W1 is substantially the same as a force to be applied to the edge cleaning member 10 at a time when the edge cleaning member 10 cleans the another-side edge area W2. In the present embodiment, the meaning of "substantially the same" is as described above. Accordingly, a force F1 to be applied to the edge cleaning member 10 at a time when the edge cleaning member 10 cleans the one-side edge area W1 being substantially the same as a force F2 to be applied to the edge cleaning member 10 at a time when the edge cleaning member 10 cleans the another-side edge area W2 means that F1−F2≤F1×0.05 in a case where F1≥F2, and that F2−F1≤F2×0.05 in a case where F1<F2.

The apparatus control part 50 may perform control in such a way that a force to be applied to the edge cleaning member 10 at a time when the edge cleaning member 10 cleans the one-side edge area W1 and a force to be applied to the edge cleaning member 10 at a time when the edge cleaning member 10 cleans the another-side edge area W2 are greater than a force to be applied to the edge cleaning member 10 at a time when the edge cleaning member 10 cleans the side face area W3.

Figure 6:
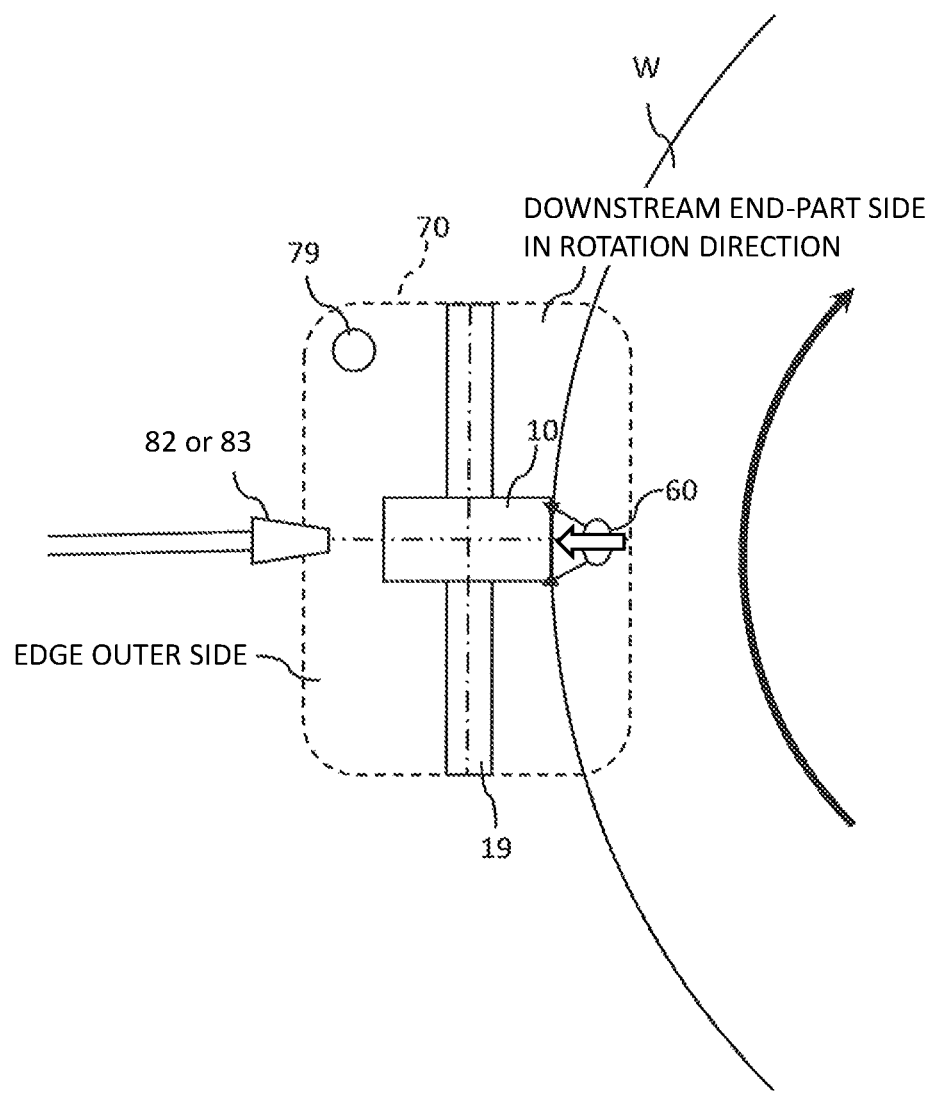
FIG. 6 is a plan view illustrating an edge cleaning liquid supplying part that can be used in the first embodiment of the present invention.

As illustrated in FIG. 6, an edge cleaning liquid supplying part 60 that supplies cleaning liquid to a contact portion between the edge cleaning member 10 and the substrate W in a direction toward the edge part from a center part of the substrate W may be provided. The edge cleaning liquid supplying part 60 may have an edge cleaning liquid supplying nozzle to supply cleaning liquid from the edge cleaning liquid supplying nozzle toward an edge outer side, and, for example, an aspect may be employed in which cleaning liquid is injected toward the edge outer side. In FIG. 6, an aspect is employed in which the edge cleaning liquid supplying part 60 is provided on one side (an upper side) of the substrate W, but this is not restrictive. In FIG. 6, the edge cleaning liquid supplying part 60 may be provided on another side (a lower side) of the substrate W, or the edge cleaning liquid supplying part 60 may be provided on both the one side (the upper side) and the another side (the lower side) of the substrate W.

Figure 7:
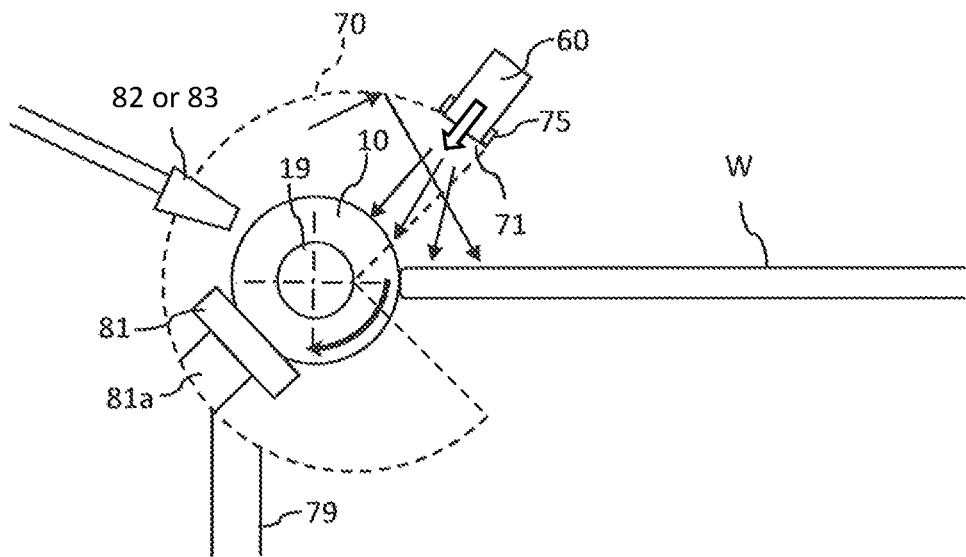
FIG. 7 is a side view illustrating the edge cleaning liquid supplying part, an edge cleaning mechanism, and the like that can be used in the first embodiment of the present invention, and an arrow in the FIG. 7 indicates cleaning liquid that is supplied from the edge cleaning liquid supplying part.
Figure 10:
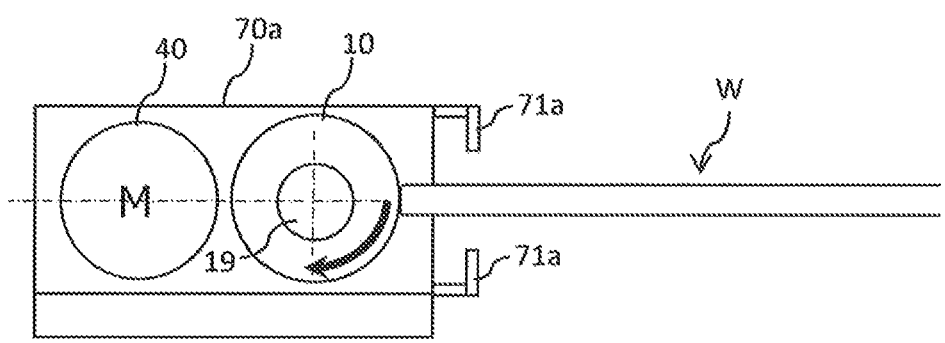
FIG. 10 is a diagram that corresponds to FIG. 3, and is a side view illustrating a modification of a bulkhead.

A bulkhead 71 may be provided on a center side of the substrate W with respect to the edge cleaning member 10 (see FIG. 7). In addition, a cover member 70 may be provided to cover the edge cleaning member 10, and part of the cover member 70 may have the bulkhead 71. Such an aspect is not restrictive, and a bulkhead 71a having a plate shape, as illustrated in FIG. 10, may be employed.

In an aspect in which the edge cleaning liquid supplying part 60 is provided, the edge cleaning liquid supplying part 60 may be attached to the cover member 70. An attachment part 75 that is used to attach the edge cleaning liquid supplying part 60 may be provided at the cover member 70, and the edge cleaning liquid supplying part 60 may be provided to be attachable to the attachment part 75. In addition, a configuration may be employed in which the edge cleaning member 10 is attached to the cover member 70, and the edge cleaning member 10 may be exchangeable by attaching the entirety of the cover member 70 provided with the edge cleaning member 10 to an attachment part (not illustrated) of the substrate cleaning apparatus. In these aspects, the time required to exchange the edge cleaning liquid supplying part 60 can be reduced, and this can avoid a reduction in an operation rate of the substrate cleaning apparatus. Note that, in a case where an aspect has been employed in which the edge cleaning liquid supplying part 60 is attached to the cover member 70, an attachment position of the edge cleaning liquid supplying part 60 with respect to the edge cleaning member 10 can be determined in advance, and the edge cleaning liquid supplying part 60 can be quickly exchanged. In addition, a desired cleaning effect of cleaning liquid can be exhibited.

In an aspect in which the edge cleaning liquid supplying part 60 is provided, a discharge outlet 79 that discharges cleaning liquid supplied from the edge cleaning liquid supplying part 60 may be provided at the cover member 70 (see FIG. 6). The discharge outlet 79 may be provided on a face on another side (a lower face) of the cover member 70. The discharge outlet 79 may be provided on the lower face to be located on an edge outer side (a left-hand side of an alternating long and short dashed line in FIG. 6) of the cover member 70. Here, the edge outer side means an area that is located on an edge outer side of the center of the cover member 70 when the cover member 70 is viewed along a straight line drawn from the center of the substrate W toward an edge. In addition, the discharge outlet 79 may be provided on a downstream end-part side (an upper side of an alternating long and two short dashed line in FIG. 6) in a rotation direction of the substrate W (in FIG. 6, a thick solid-line arrow in the substrate W). Here, the downstream end-part side in the rotation direction of the substrate W means a downstream side in the rotation direction of the substrate W of the center of the cover member 70. By providing the discharge outlet 79 on the edge outer side and/or the downstream end-part side in the rotation direction of the substrate W of the cover member 70, cleaning liquid that flows into the cover member 70 can be efficiently discharged due to the rotation of the substrate W.

An edge cleaning mechanism that cleans the edge cleaning member 10 may be provided. The edge cleaning mechanism may be a contact member 81, such as a contact plate, that can abut onto the edge cleaning member 10 (see FIG. 7). The contact member 81 may be made of a quartz plate or the like. A pressing part 81a that presses the contact member 81 may be provided and the apparatus control part 50 may control this pressing part 81a such that control is performed to clean the edge cleaning member 10 or stop cleaning the edge cleaning member 10. Stated another way, the pressing part 81a may cause the contact member 81 to abut onto the edge cleaning member 10 such that the edge cleaning member 10 is cleaned, or the pressing part 81a may separate the contact member 81 from the edge cleaning member 10 such that the cleaning of the edge cleaning member 10 is stopped. The edge cleaning mechanism may be a cleaning liquid supplying member 82 that supplies cleaning liquid to the edge cleaning member 10 (see FIGS. 6 and 7). The edge cleaning mechanism may be a suction member 83 that sucks the edge cleaning member 10 (see FIGS. 6 and 7). In addition, the edge cleaning mechanism may have any one or more of the contact member 81, the cleaning liquid supplying member 82, and the suction member 83. The cleaning liquid supplying member 82 may be a fluid nozzle that injects cleaning liquid toward the edge cleaning member 10. The suction member 83 may be a suction nozzle that abuts onto the edge cleaning member 10 or is provided to be close to the edge cleaning member 10. The cleaning liquid supplying member 82 may be a megasonic cleaning nozzle that performs megasonic cleaning, or may be a two-fluid nozzle that performs cleaning using two fluids. Further, the cleaning liquid supplying member 82 may swing with an axis along a normal direction of the substrate W (for example, an axis that extends in an upward or downward direction) as a center, or may swing with an axis along an in-plane direction of the substrate W (for example, an axis that extends in a horizontal direction) as a center.

The apparatus control part 50 may perform control in such a way that the edge cleaning mechanism cleans the edge cleaning member 10 during a time period in which the edge cleaning member 10 does not clean the edge part of the substrate W. However, this is not restrictive. The apparatus control part 50 may perform control in such a way that a time period during which the edge cleaning member 10 cleans the edge part of the substrate W at least partially overlaps a time period during which the edge cleaning mechanism cleans the edge cleaning member 10, or the apparatus control part 50 may perform control in such a way that the time period during which the edge cleaning member 10 cleans the edge part of the substrate W completely overlaps the time period during which the edge cleaning mechanism cleans the edge cleaning member 10. In a case where the edge cleaning mechanism has the contact member 81, a configuration may be employed in which the contact member 81 moves together with the edge cleaning member 10 (for example, in an upward or downward direction and a leftward or rightward direction). In a case where the edge cleaning mechanism has the cleaning liquid supplying member 82 or the suction member 83, an aspect may be employed in which the cleaning liquid supplying member 82 or the suction member 83 moves together with the edge cleaning member 10 (for example, in the upward or downward direction and the leftward or rightward direction), or an aspect may be employed in which the angle of the cleaning liquid supplying member 82 or the suction member 83 changes according to the movement position of the edge cleaning member 10.

Figure 8:
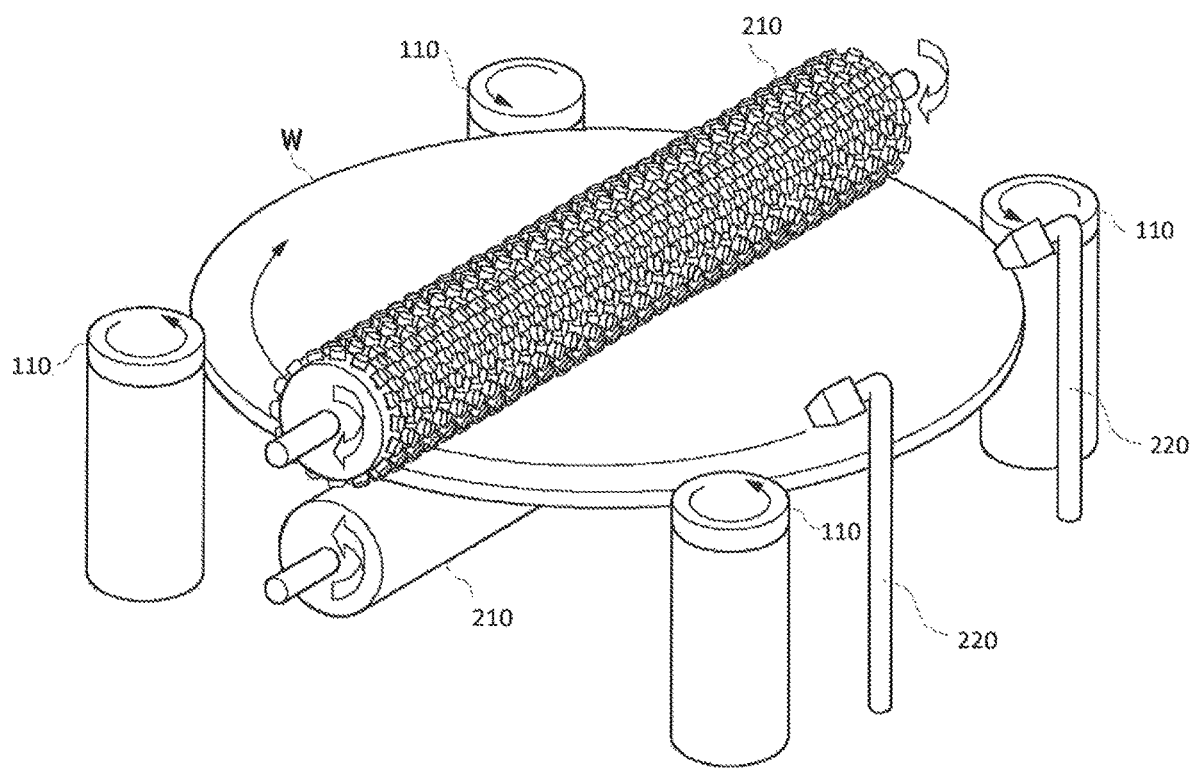
FIG. 8 is a perspective view illustrating a substrate cleaning member, a substrate cleaning liquid supplying part, and the like that can be used in the first embodiment of the present invention.

As illustrated in FIG. 8, a substrate cleaning member 210 that abuts onto and cleans a face on one side (an upper face) and/or a face on another side (a lower face) of the substrate W and that is made of the roll cleaning member described above, a pencil cleaning member, or the like may be provided (FIG. 8 illustrates the roll cleaning member). In addition, a substrate cleaning liquid supplying part 220 that supplies cleaning liquid to the substrate W may be provided.

The apparatus control part 50 may perform control in such a way that a time period during which the substrate cleaning member 210 cleans the face on the one side or the face on the another side of the substrate W at least partially overlaps a time period during which the edge cleaning member 10 cleans the edge part of the substrate W. The control part may perform control in such a way that the edge cleaning member 10 cleans the edge part of the substrate W during the entire time period during which the substrate cleaning member 210 cleans the substrate W, or the control part may perform control in such a way that the substrate cleaning member 210 cleans the substrate W during the entire time period during which the edge cleaning member 10 cleans the edge part of the substrate W.

<<Effects>>

Next, effects according to the present embodiment having the configuration described above that have not yet been described are principally described. Even in a case where description is not provided as a "configuration", all of the configurations that are described as an "effect" can be employed in the present invention.

In a case where an aspect has been employed in which the first moving part 31 and the second moving part 36 are controlled in such a way that a position of the edge cleaning member 10 with respect to the edge part of the substrate W is moved and the edge cleaning member 10 cleans the one-side edge area W1, the side face area W3, and the another-side edge area W2, not only a side face but also a face on one side and a face on another side in the edge part of the substrate W can be more reliably cleaned. The side face of the substrate W is rarely flat, and a distal end of the substrate W is often thin. Therefore, by moving a position of the edge cleaning member 10 with respect to the edge part of the substrate W, the one-side edge area W1 and the another-side edge area W2 can be more reliably cleaned. In addition, the side face of the substrate W is tapered. Therefore, in a case where the edge cleaning member 10 is fixed, the edge cleaning member 10 is shaved by an edge of the tapered substrate W. However, in a case where the edge cleaning member 10 moves, as in the present aspect, a contact position between the edge of the substrate W and the edge cleaning member 10 can be changed, and this can avoid the occurrence of abrasion in a fixed position of the edge cleaning member 10. Therefore, a cleaning effect of the edge cleaning member 10 can be exhibited during a long period, and the occurrence of a situation where the edge cleaning member 10 that has deteriorated in a cleaning effect fails to clean the edge part (the bevel) of the substrate W can be avoided. Note that, in a case where the substrate W is made of a wafer, a variety of films are provided, and therefore the edge part (the bevel) of the substrate W is more easily stained.

Figure 12:
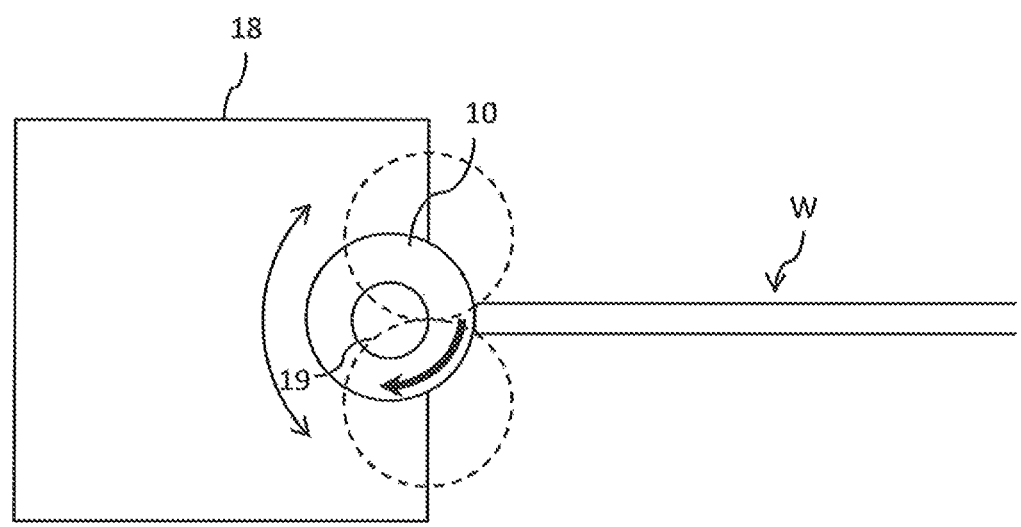
FIG. 12 is a side view illustrating an aspect in which an edge cleaning member is moved by an oscillation mechanism.

Note that an oscillation mechanism 18 that causes the edge cleaning member 10 to oscillate over the one-side edge area W1, the side face area W3, and the another-side edge area W2 (see FIG. 12), without employing an aspect in which the first moving part 31 and the second moving part 36 are controlled may be provided.

In a case where the edge cleaning member 10 is rotated around an axis that is parallel to the substrate rotary shaft 130 (for example, an axis that extends in an upward or downward direction), cleaning liquid that has been scattered from the edge cleaning member 10 easily reaches the substrate W. However, in a case where an aspect has been employed in which the edge cleaning member 10 is rotated around the edge rotary shaft 19 that extends in a direction that is orthogonal to the substrate rotary shaft 130 (for example, along an axis that extends in a leftward or rightward direction), it can be made difficult that cleaning liquid that has been scattered due to the rotation of the edge cleaning member 10 reaches the substrate W. The speed of rotation per unit time of the edge cleaning member 10 is significantly higher than the speed of rotation per unit time of the substrate W, and therefore cleaning liquid is likely to be scattered from the edge cleaning member 10 to the substrate W. Therefore, it is effective to employ an aspect in which the edge cleaning member 10 is rotated around the edge rotary shaft 19 that extends in a direction that is orthogonal to the substrate rotary shaft 130. Note that, in a case where the substrate W is made of a wafer, as an example, the speed of rotation of the edge cleaning member 10 is ten times the speed of rotation of the substrate W. When it is assumed, for example, that the speed of rotation of the substrate W is 100 rotations, the speed of rotation of the edge cleaning member 10 is 1000 rotations.

In a case where an aspect is employed in which the apparatus control part 50 performs control in such a way that the edge cleaning member 10 cleans the one-side edge area W1 during a predetermined first time period T1, the edge cleaning member 10 cleans the side face area W3 during a predetermined third time period T3, and then the edge cleaning member 10 cleans the another-side edge area W2 during a predetermined second time period T2, stains that have adhered to the edge part of the substrate W can be sequentially moved from a face on one side to a face on another side, and removed stains can be prevented from adhering to another portion of the substrate W. This aspect is particularly effective in a case where the face on the one side is located on an upper side and the face on the another side is located on a lower side. In this case, after the edge cleaning member 10 has cleaned the one-side edge area W1 during the predetermined first time period T1, the second moving part 36 moves the edge cleaning member 10 to be separated from the edge part of the substrate W. Then, the first moving part 31 moves the edge cleaning member 10 in a normal direction of the substrate W (for example, in a downward direction), and the second moving part 36 brings the edge cleaning member 10 close to the side face area W3 of the substrate W, and moves the edge cleaning member 10 until the edge cleaning member 10 abuts onto the side face area W3 of the substrate W or a predetermined force is applied to the edge cleaning member 10. After the edge cleaning member 10 cleans the side face area W3 during the predetermined third time period T3, the second moving part 36 moves the edge cleaning member 10 to be separated from the edge part of the substrate W. Then, the first moving part 31 moves the edge cleaning member 10 in the normal direction of the substrate W (for example, in a downward direction), the second moving part 36 brings the edge cleaning member 10 close to the another-side edge area W2 of the substrate W, and moves the edge cleaning member 10 until the edge cleaning member 10 abuts onto the another-side edge area W2 of the substrate W or a predetermined force is applied to the edge cleaning member 10. Then, the edge cleaning member 10 cleans the another-side edge area W2 during the predetermined second time period T2.

In a case where an aspect is employed in which the apparatus control part 50 performs control in such a way that a force to be applied to the edge cleaning member 10 at a time when the edge cleaning member 10 cleans the one-side edge area W1 or the another-side edge area W2 is different from a force to be applied to the edge cleaning member 10 at a time when the edge cleaning member 10 cleans the side face area W3, the edge part of the substrate W can be cleaned at a force that is different between a case where the edge cleaning member 10 cleans a side face of the substrate W and a case where the edge cleaning member 10 cleans a face on one side or a face on another side in the edge part of the substrate W.

In a case where an aspect is employed in which the apparatus control part 50 performs control in such a way that a force to be applied to the edge cleaning member 10 at a time when the edge cleaning member 10 cleans the one-side edge area W1 is substantially the same as a force to be applied to the edge cleaning member 10 at a time when the edge cleaning member 10 cleans the another-side edge area W2, the edge part of the substrate W can be cleaned at a similar force in a case where the edge cleaning member 10 cleans a face on one side in the edge part of the substrate W and in a case where the edge cleaning member 10 cleans a face on another side in the edge part of the substrate W.

In a case where an aspect is employed in which the apparatus control part 50 performs control in such a way that a force to be applied to the edge cleaning member 10 at a time when the edge cleaning member 10 cleans the one-side edge area W1 and a force to be applied to the edge cleaning member 10 at a time when the edge cleaning member 10 cleans the another-side edge area W2 are greater than a force to be applied to the edge cleaning member 10 at a time when the edge cleaning member 10 cleans the side face area W3, a force is applied from an oblique direction, and therefore even the one-side edge area W1 and the another-side edge area W2 that it is difficult to apply a force to can be cleaned more reliably. At this time, the apparatus control part 50 may perform control on the basis of a calculation result obtained by resolving a manner of applying a force by using a vector in such a way that forces to be applied to the one-side edge area W1 and the another-side edge area W2 are substantially the same as a force to be applied to the side face area W3.

In addition, in a case where either a face on one side or a face on another side of the substrate W is desired to be more reliably cleaned, the apparatus control part 50 may perform control to increase a force to be applied to the edge cleaning member 10 at a time when an edge part on a face that is desired to be reliably cleaned is cleaned. As an example, in a case where the one-side edge area W1 is desired to be cleaned more reliably than the another-side edge area W2, the apparatus control part 50 may perform control in such a way that a force to be applied to the edge cleaning member 10 at a time when the one-side edge area W1 is cleaned by the edge cleaning member 10 is greater than a force to be applied to the edge cleaning member 10 at a time when the another-side edge area W2 is cleaned by the edge cleaning member 10. In addition, in this case, the apparatus control part 50 may perform control in such a way that the first time period T1 during which the one-side edge area W1 is cleaned by the edge cleaning member 10 is longer than the second time period T2 during which the another-side edge area W2 is cleaned by the edge cleaning member 10. In a case where the another-side edge area W2 is desired to be cleaned more reliably than the one-side edge area W1, the apparatus control part 50 may perform reverse control.

In a case where the edge cleaning liquid supplying part 60 that supplies cleaning liquid in a contact portion between the edge cleaning member 10 and the substrate W in a direction toward the edge part from the center part of the substrate W is provided, the edge part of the substrate W can be cleaned with cleaning liquid, and a situation where cleaning liquid flows (flows back) from the edge part of the substrate W toward the center part of the substrate W and a center area of the substrate W is stained can also be avoided.

In a case where an aspect has been employed in which the bulkhead 71 or 71*a* is provided on a side of the center part of the substrate W of the edge cleaning member 10 (see FIGS. 7 and 10), a situation where cleaning liquid supplied from the edge cleaning liquid supplying part 60 splashes and a side of the center of the substrate W is stained can be avoided. From this viewpoint, a configuration is effective in which the edge cleaning member 10 is covered with the cover member 70 that has the bulkhead 71.

In a case where an aspect has been employed in which the edge cleaning liquid supplying part 60 is attached to the cover member 70, as illustrated in FIG. 7, the edge cleaning liquid supplying part 60 can be placed in a predetermined position, and this enables cleaning liquid to be supplied in a fixed position of the edge part of the substrate W. Therefore, a uniform cleaning effect is easily exhibited.

In a case where an aspect has been employed in which the cover member 70 is provided with the discharge outlet 79 that discharges cleaning liquid supplied from the edge cleaning liquid supplying part 60, as illustrated in FIGS. 6 and 7, the supplied cleaning liquid can be efficiently discharged.

In a case where an aspect has been employed in which the edge cleaning mechanism that cleans the edge cleaning member 10 is provided, as illustrated in FIG. 7, the edge cleaning member 10 can be prevented from being stained, and this results in an increase in an effect of cleaning the edge part of the substrate W.

In a case where the contact member 81 that can abut onto the edge cleaning member 10 has been used as the edge cleaning mechanism, stains that have adhered to the edge cleaning member 10 can be removed due to a physical contact. In a case where the cleaning liquid supplying member 82 that supplies cleaning liquid to the edge cleaning member 10 has been used as the edge cleaning mechanism, stains that have adhered to the edge cleaning member 10 can be removed due to the cleaning liquid. In a case where the suction member 83 that sucks the edge cleaning member 10 has been used as the edge cleaning mechanism, stains that have adhered to the edge cleaning member 10 can be removed by sucking the stains.

In a case where an aspect has been employed in which the edge cleaning mechanism cleans the edge cleaning member 10 during a time period during which the edge cleaning member 10 does not clean the edge part of the substrate W, stains generated by cleaning the edge cleaning member 10 can be prevented from adhering to the substrate W. In particular, this aspect is effective in a case where the contact member 81 or the cleaning liquid supplying member 82 has been employed as the edge cleaning mechanism.

In a case where the apparatus control part 50 performs control in such a way that a time period during which the edge cleaning member 10 cleans the edge part of the substrate W at least partially overlaps a time period during which the edge cleaning mechanism cleans the edge cleaning member 10, a time period during which the cleaning of the edge part of the substrate W is stopped while the edge cleaning member 10 is cleaned can be reduced, and throughput can be increased. In particular, this aspect is effective in a case where the suction member 83 has been employed as the edge cleaning mechanism.

In a case where the apparatus control part 50 performs control in such a way that a time period during which the substrate cleaning member 210 cleans a face on one side or a face on another side of the substrate W at least partially overlaps a time period during which the edge cleaning member 10 cleans the edge part of the substrate W, a part including the center part of the substrate W and excluding the edge part and the edge part of the substrate W can be simultaneously cleaned, and a time period during which only the edge part of the substrate W is cleaned can be reduced or eliminated. As a result of this, the time required to clean one substrate W can be reduced, and the operation rate of the substrate cleaning apparatus can be increased.

Figure 11A:
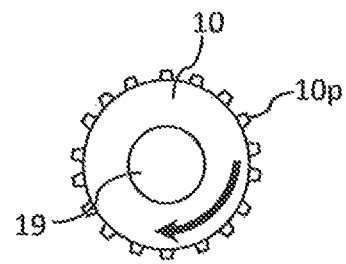
FIG. 11A is a side view illustrating an edge cleaning member that has projection parts.
Figure 11B:
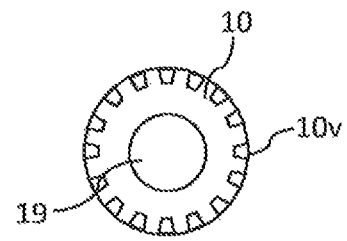
FIG. 11B is a side view illustrating an edge cleaning member that has grooves.

As illustrated in FIG. 11A, the edge cleaning member 10 may have a plurality of projection parts 10p similarly to an upper-side roll cleaning member illustrated in FIG. 8. In a case where such an aspect has been employed, the projection parts 10p abut onto the edge part of the substrate W, and therefore the edge part of the substrate W can be cleaned. A higher cleaning effect can be exhibited. In addition, the edge cleaning member 10 may have grooves 10v, as illustrated in FIG. 11B. In this case, similarly, an area between the grooves 10v has a function that is similar to a function of the projection part 10p, and a cleaning effect can be increased. The grooves 10v may be provided consecutively or intermittently on a longer side of the edge cleaning member 10.

Figure 13A:
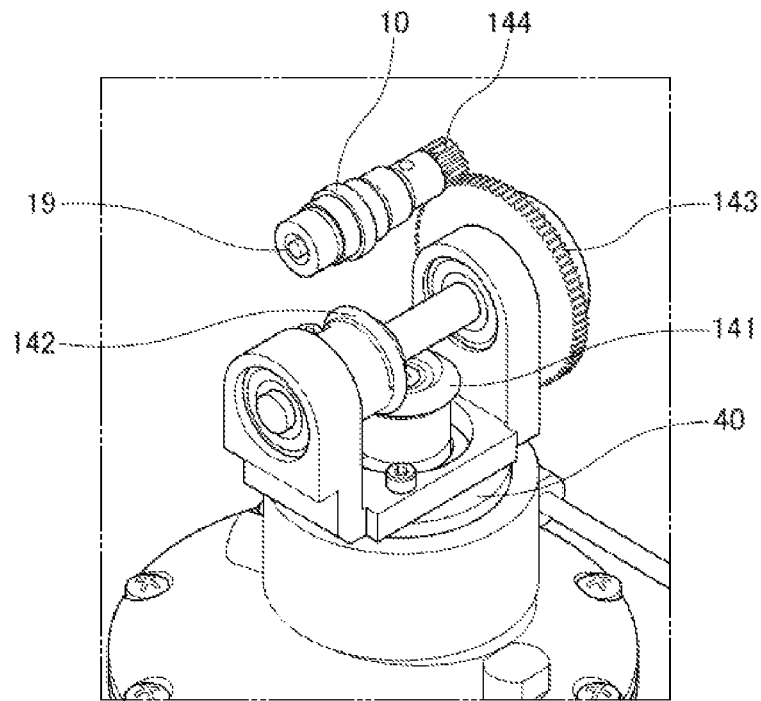
FIG. 13A is a perspective view illustrating an edge cleaning member, an edge rotating part, and the like that can be used in another aspect of the first embodiment of the present invention.
Figure 13B:
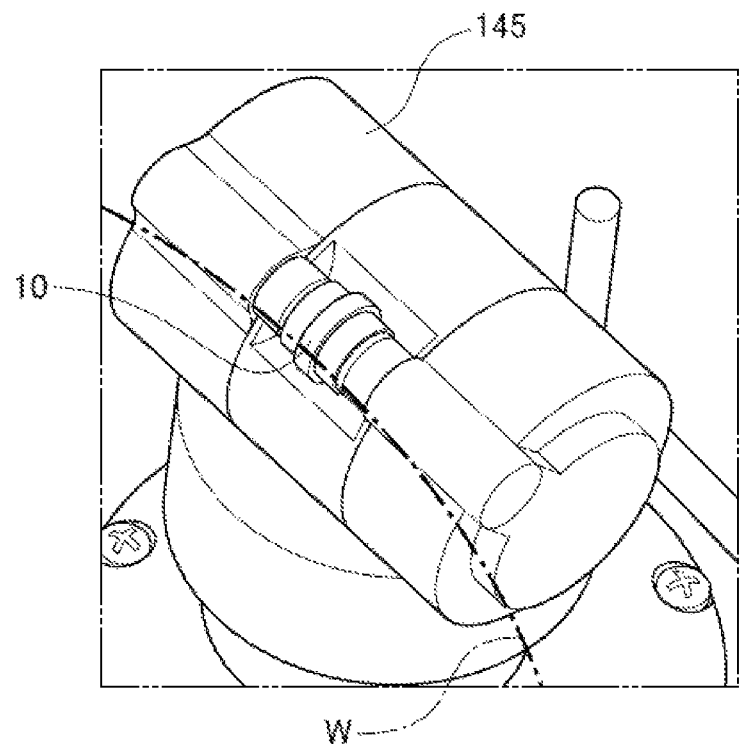
FIG. 13B is a perspective view illustrating an aspect in which the edge rotating part and the like that are illustrated in FIG. 13A are covered with a driving cover member.

In addition, the aspect illustrated in FIGS. 13A and 13B may be employed. In the aspect illustrated in FIGS. 13A and 13B, the edge cleaning member 10 is provided on one side (as an example, an upper side) of the edge rotating part 40, and the edge rotating part 40 and the edge rotary shaft 19 are coupled via gear members 141 to 144. In the present aspect, a driving cover member 145 that covers the edge rotary shaft 19 and the gear members 141 to 144 but does not cover the edge cleaning member 10 is provided. The edge cleaning member 10 is attached to the edge rotary shaft 19 in an exchangeable manner. The edge rotary shaft 19 is rotatably supported by the driving cover member 145 via a bearing (a reference sign is omitted). A rotary shaft (a reference sign is omitted) that is coupled to the gear member 142 and the gear member 143 is rotatably supported by a pedestal (a reference sign is omitted) via a bearing (a reference sign is omitted). In addition, the edge rotating part 40 (a driving motor) supports the pedestal (a reference sign is omitted). In the present aspect, the driving cover member 145 and the edge cleaning member 10 may be moved integrally (as a whole) by the first moving part 31 and the second moving part 36.

Second Embodiment

Next, a second embodiment will be described.

In the first embodiment, an aspect has been employed in which one edge cleaning member 10 is provided, but in the present embodiment, an aspect is employed in which two or more members that clean the edge part of the substrate W are provided, as illustrated in FIGS. 14 to 17. In the other points, the second embodiment is similar to the first embodiment, and all of the configurations employed in the first embodiment can also be employed in the second embodiment. The members described in the first embodiment are described by using the same reference signs.

Figure 14:
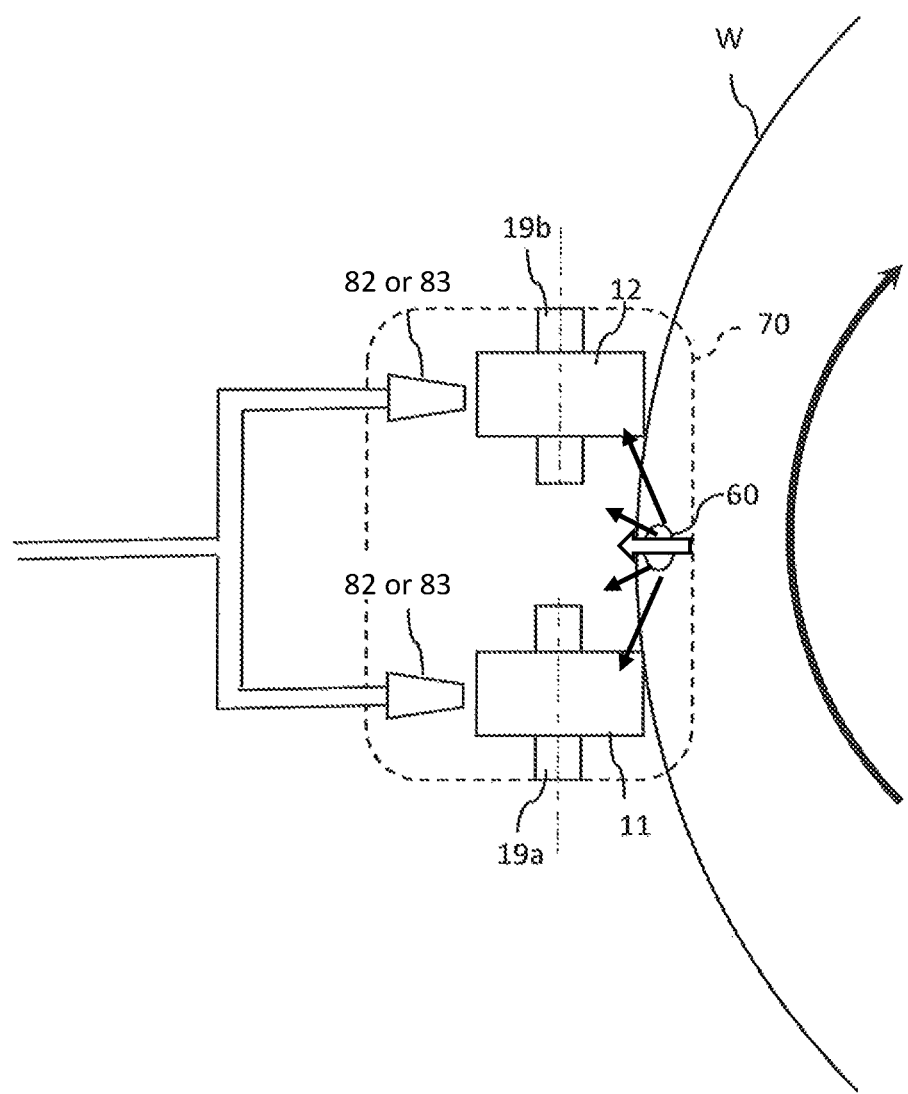
FIG. 14 is a plan view of a substrate cleaning apparatus that can be used in one aspect of a second embodiment of the present invention.
Figure 15:
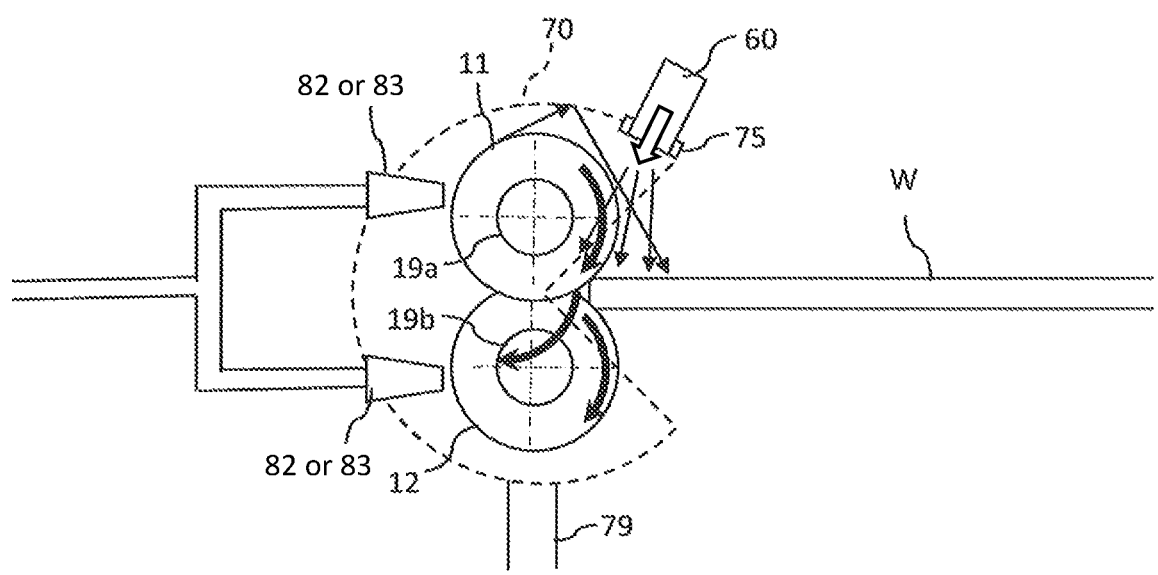
FIG. 15 is a side view of the substrate cleaning apparatus that can be used in the one aspect of the second embodiment of the present invention.

As illustrated in FIGS. 14 and 15, the edge cleaning member 10 may have a first edge cleaning member 11 that abuts onto and cleans at least a part of one side of a side face and a face on the one side in the edge part of the substrate W, and a second edge cleaning member 12 that abuts onto and cleans at least a part of another side of the side face and a face on the another side in the edge part of the substrate W.

In a case where such an aspect has been employed, the first edge cleaning member 11 can clean the part on the one side of the side face and the face on the one side in the edge part of the substrate W, and the second edge cleaning member 12 can clean the part on the another side of the side face and the face on the another side in the edge part of the substrate W. The entirety of the edge part of the substrate W can be cleaned by the two edge cleaning members 11 and 12.

In a case where the second edge cleaning member 12 is located on a lower side of the first edge cleaning member 11, it is effective that the first edge cleaning member 11 is located on an upstream side of a rotation direction of the substrate W (a lower side in FIG. 14) and the second edge cleaning member 12 is located on a downstream side of the rotation direction of the substrate W (an upper side in FIG. 14) (also see FIG. 15). By employing this aspect, even in a case where cleaning liquid that has cleaned one side (an upper side) of the substrate W has sneaked into another side (a lower side), the cleaning liquid can be washed away by the second edge cleaning member 12.

Figure 16:
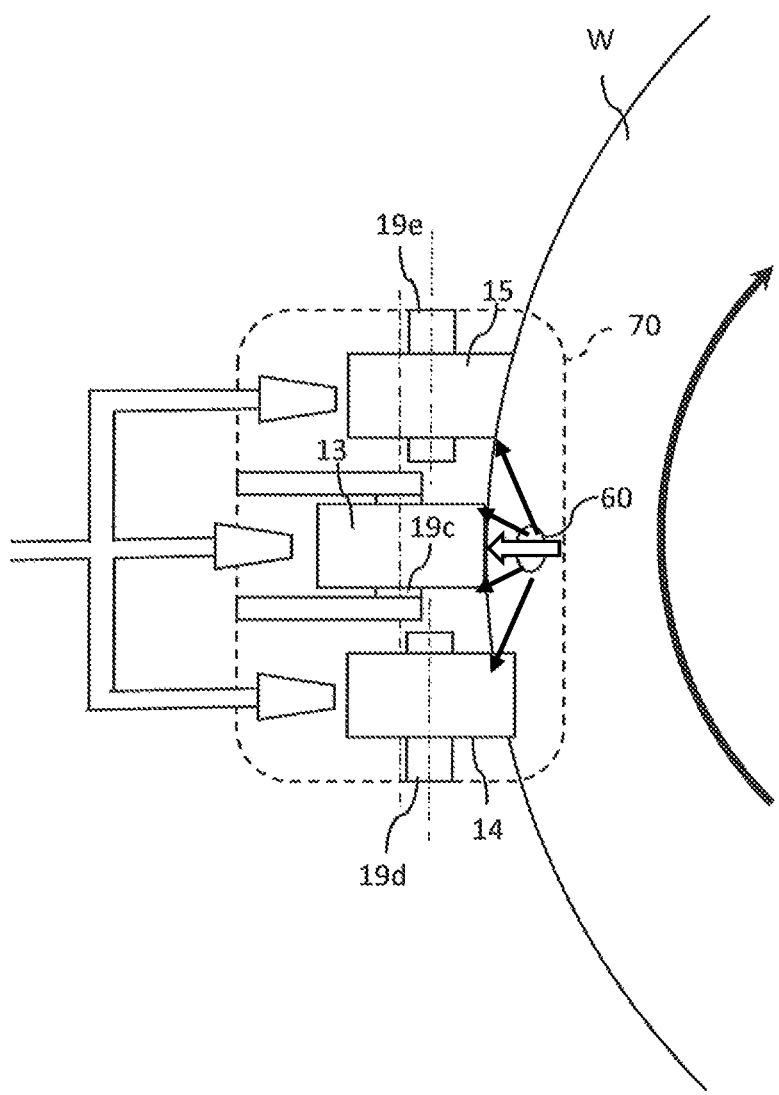
FIG. 16 is a plan view of a substrate cleaning apparatus that can be used in another aspect of the second embodiment of the present invention.
Figure 17:
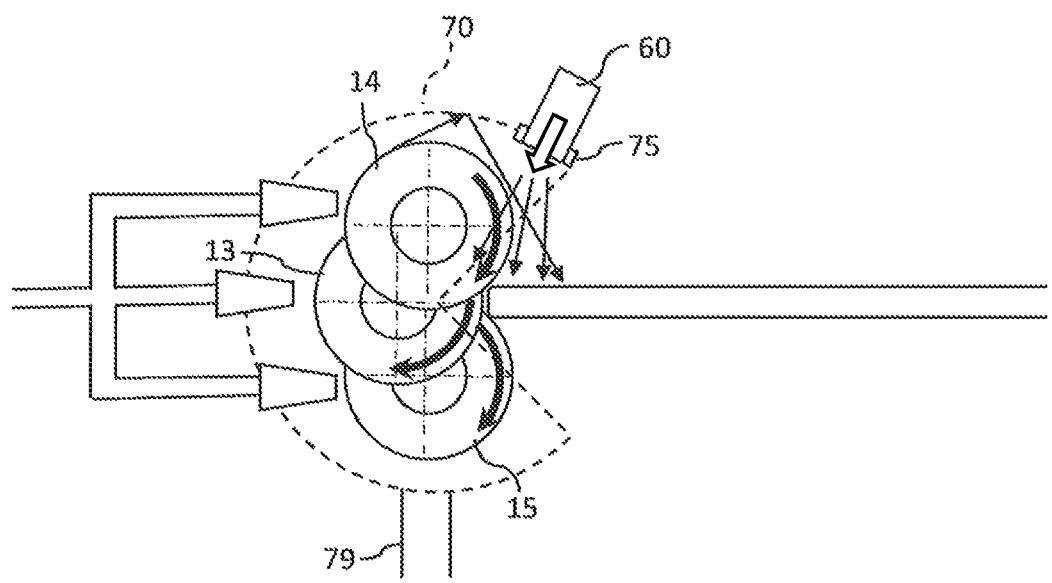
FIG. 17 is a side view of the substrate cleaning apparatus that can be used in the other aspect of the second embodiment of the present invention.

In addition, as illustrated in FIGS. 16 and 17, the edge cleaning member 10 may have a third edge cleaning member 13 that abuts onto and cleans at least a side face of the substrate W, a fourth edge cleaning member 14 that abuts onto and cleans at least a face on one side in the edge part of the substrate W, and a fifth edge cleaning member 15 that abuts onto and cleans at least a face on another side in the edge part of the substrate W.

In a case where such an aspect has been employed, the third edge cleaning member 13 can clean the side face of the substrate W, the fourth edge cleaning member 14 can clean the face on the one side in the edge part of the substrate W, and the fifth edge cleaning member 15 can clean the face on the another side in the edge part of the substrate W.

For a reason that is similar to the reason described with respect to the first edge cleaning member 11 and the second edge cleaning member 12, in a case where the fourth edge cleaning member 14, the third edge cleaning member 13, and the fifth edge cleaning member 15 are placed in a downward direction in this order, it is effective that the fourth edge cleaning member 14 is located on an upstream side of a rotation direction of the substrate W (a lower side in FIG. 16) with respect to the third edge cleaning member 13 and the third edge cleaning member 13 is located on the upstream side of the rotation direction of the substrate W (the lower side in FIG. 16) with respect to the fifth edge cleaning member 15 (also see FIG. 17).

As described above, in a case where a plurality of edge cleaning members 11 to 15 is provided, the plurality of edge cleaning members 11 to 15 does not always need to be moved. On the other hand, the size of an apparatus increases, for example, in order to secure a space in which the plurality of edge cleaning members 11 to 15 is housed. Therefore, in a case where a small-sized apparatus is desired to be employed, it is effective to employ the aspect described in the first embodiment.

A rotation speed and a rotation direction of each of the first edge cleaning member 11 and the second edge cleaning member 12 may be independently controllable by the apparatus control part 50. Similarly, a rotation speed and a rotation direction of each of the third edge cleaning member 13, the fourth edge cleaning member 14, and the fifth edge cleaning member 15 may be independently controllable by the apparatus control part 50.

It has been described above that all of the configurations employed in the first embodiment can also be employed in the second embodiment. Similarly, in the present embodiment, an aspect that is similar to an aspect employed in the first embodiment can be employed. For example, in the present embodiment, similarly to the first embodiment, an aspect may be employed in which either the first edge cleaning member 11 or the second edge cleaning member 12 or both the first edge cleaning member 11 and the second edge cleaning member 12, or any one or more or all of the third edge cleaning member 13, the fourth edge cleaning member 14, and the fifth edge cleaning member 15 move over the one-side edge area W1, the side face area W3, and the another-side edge area W2 of the substrate W.

Third Embodiment

Next, a third embodiment of the present invention will be described.

In the present embodiment, an aspect is employed in which the apparatus control part 50 performs control to separate the edge cleaning member 10 from the edge part of the substrate W, and then stop the rotation of the substrate W caused by the substrate rotating part 110. In the present embodiment, similarly, all of the configurations employed in the respective embodiments described above can be employed. The members described in the respective embodiments described above are described by using the same reference signs.

If the rotation of the substrate W is stopped before the edge cleaning member 10 is separated from the edge part of the substrate W, there is a possibility that cleaning liquid that has adhered to or has been absorbed into the edge cleaning member 10 will flow back to the substrate W and the substrate W will be stained. As in the present embodiment, in a case where an aspect has been employed in which the rotation of the substrate W caused by the substrate rotating part 110 is stopped after the edge cleaning member 10 is separated from the edge part of the substrate W, such contamination of the substrate W can be avoided.

The apparatus control part 50 may perform control to stop the supply of cleaning liquid from the substrate cleaning liquid supplying part 220 after the edge cleaning member 10 is separated from the edge part of the substrate W and before the rotation of the substrate W caused by the substrate rotating part 110 is stopped. In a case where this aspect has been employed, the rotation of the substrate W is stopped after the supply of cleaning liquid from the substrate cleaning liquid supplying part 220 is stopped, and therefore cleaning liquid can be prevented from remaining on the substrate W. However, such an aspect is not restrictive, and the apparatus control part 50 may perform control to stop the supply of cleaning liquid from the substrate cleaning liquid supplying part 220 after the rotation of the substrate W caused by the substrate rotating part 110 is stopped.

The apparatus control part 50 may control the edge cleaning liquid supplying part 60 in addition to the substrate cleaning liquid supplying part 220 to supply cleaning liquid and stop supplying the cleaning liquid. As described in the first embodiment, control may be performed in such a way that a time period during which the substrate cleaning member 210 cleans a face on one side or a face on another side of the substrate W at least partially overlaps a time period during which the edge cleaning member 10 cleans the edge part of the substrate W.

The apparatus control part 50 may perform control to stop the rotation of the edge cleaning member 10 caused by the edge rotating part 40 before the edge cleaning member 10 is separated from the edge part of the substrate W. In a case where this aspect has been employed, cleaning liquid can be prevented from being scattered on the substrate W from the edge rotating part 40 that rotates in a state where the edge rotating part 40 is separated from the substrate W. In addition, the apparatus control part 50 may perform control to reduce a rotation speed of the edge cleaning member 10 to a threshold or less before the edge cleaning member 10 is separated from the edge part of the substrate W, clean the edge part of the substrate W during a predetermined time period, separate the edge cleaning member 10 from the edge part of the substrate W, and then stop the rotation of the edge cleaning member 10 caused by the edge rotating part 40.

<Modifications>

The modifications described below can also be employed in the respective embodiments described above.

Modification 1

Figure 18:
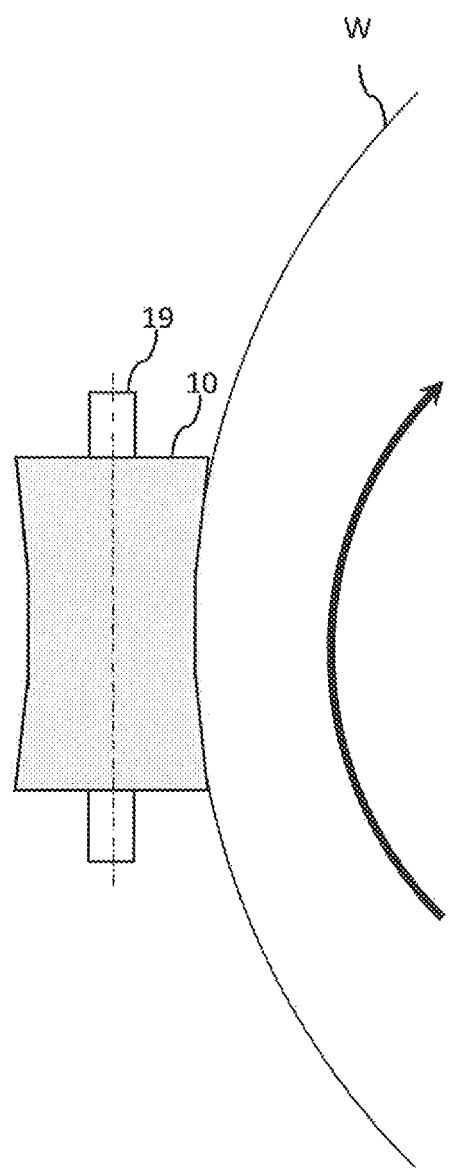
FIG. 18 is a plan view illustrating an edge cleaning member and the like that can be used in one aspect of Modification 1 of the present invention.
Figure 19:
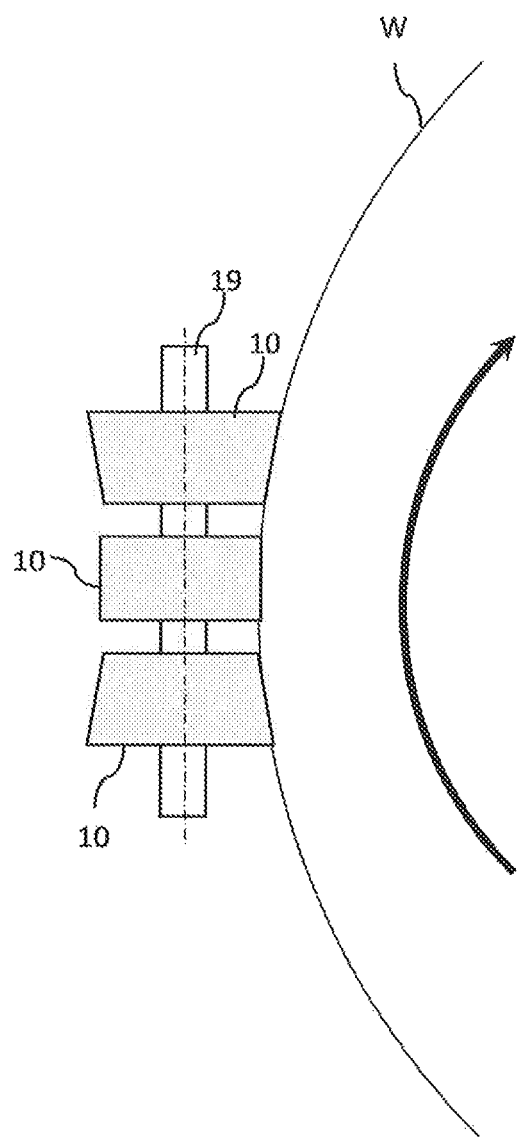
FIG. 19 is a plan view illustrating an edge cleaning member and the like that can be used in another aspect of Modification 1 of the present invention.

As described above, the edge cleaning member 10 may have a columnar shape, or as illustrated in FIGS. 18 and 19, the edge cleaning member 10 may have a shape in which a side face is curved in accordance with the shape of a wafer. To "have a shape in which a side face is curved in accordance with the shape of a wafer" means that a side face of a cleaning member has a radius of curvature that corresponds to the radius of curvature of the wafer, when viewed from one side (for example, an upper side) of the wafer. Here, radii of curvature corresponding to each other means that a difference between both radii of curvature is 5% or less of the larger radius of curvature. Stated another way, a radius of curvature R2 of a side face of a cleaning member corresponding to a radius of curvature R1 of a wafer means that $R1-R2 \leq R1 \times 0.05$ in a case where $R1 \geq R2$, and that $R2-R1 \leq R2 \times 0.05$ in a case where $R1 < R2$.

In a case where a plurality of edge cleaning members 10 is provided, each of the plurality of edge cleaning members 10 may have a shape in which a side face is curved in accordance with the shape of a wafer (see FIG. 19).

In a case where an aspect in the present modification has been employed, the edge cleaning member 10 that has been brought into surface contact with the side face or the edge part of the substrate W can clean the side face or the edge part of the substrate W. Stated another way, the side face or the edge part of the substrate W can be cleaned in a state where the contact area with the edge cleaning member 10 has been increased. Therefore, the side face of the substrate W, or the side face and the edge part of the substrate W can be cleaned more effectively.

As described above, the edge cleaning member 10, as described in the present modification, can be employed in all of the configurations employed in the respective embodiments described above.

Modification 2

Figure 20A:
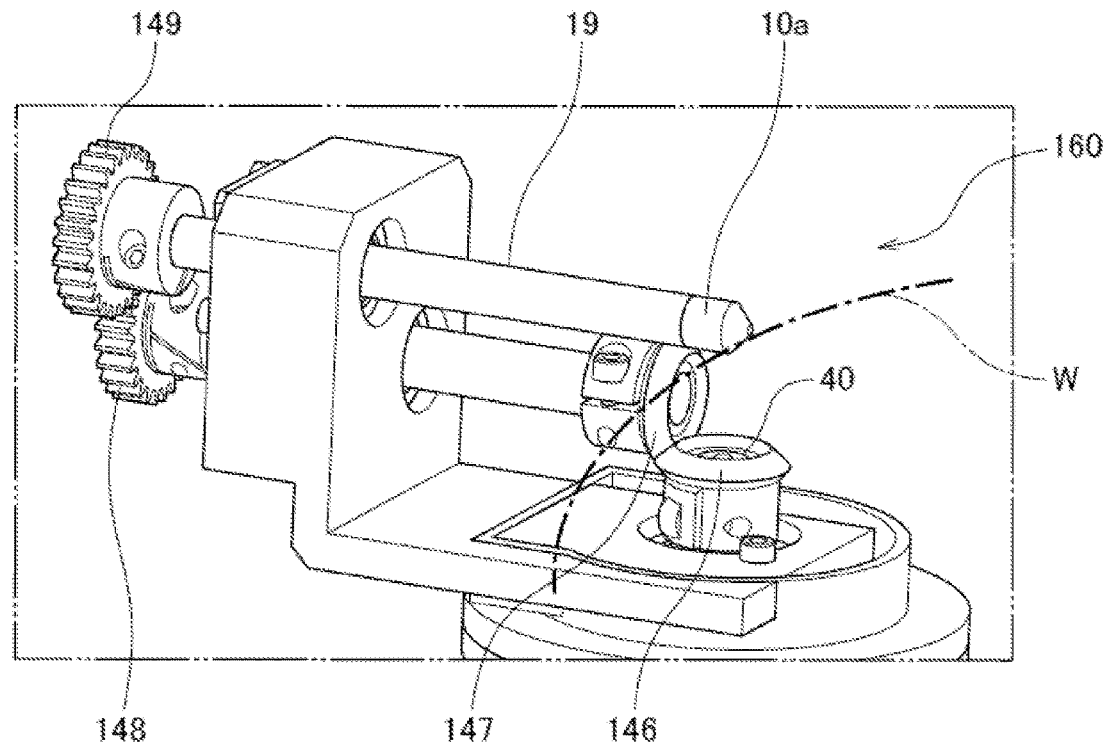
FIG. 20A is a perspective view illustrating an aspect in which an edge cleaning member that can be used in Modification 2 of the present invention is provided at a distal end of a pen unit.
Figure 20B:
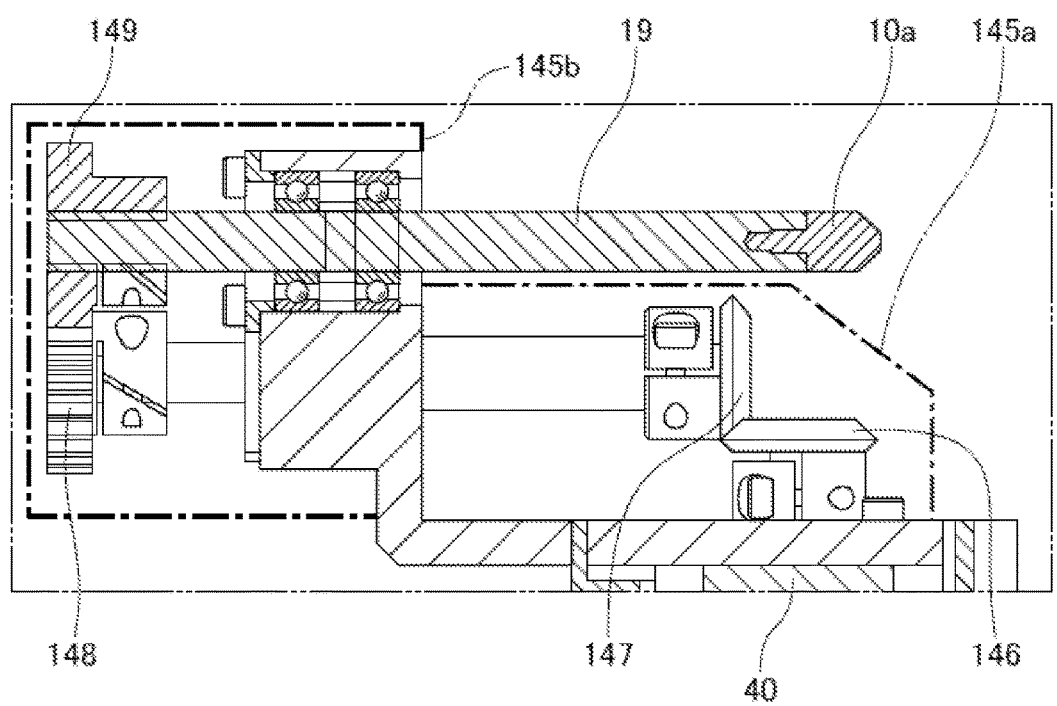
FIG. 20B is a side partial sectional view illustrating the aspect in which the edge cleaning member that can be used in Modification 2 of the present invention is provided at the distal end of the pen unit.
Figure 21:
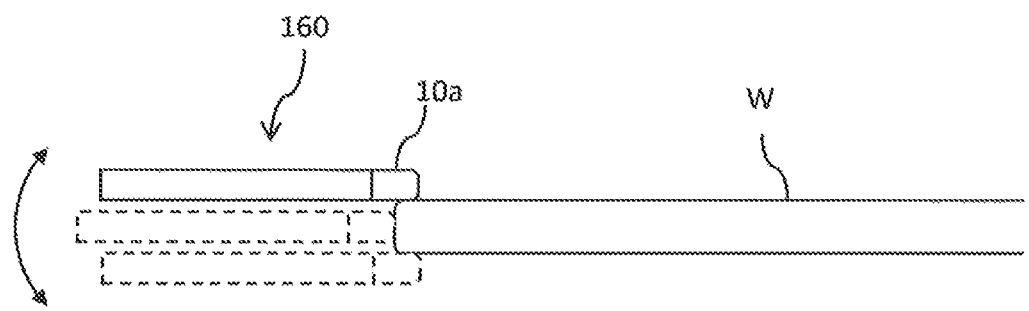
FIG. 21 is a side view illustrating a driving aspect of the pen unit in Modification 2 of the present invention.

As illustrated in FIGS. 20A, 20B, and 21, an aspect may be employed in which a pen unit 160 that is rotated by the edge rotating part 40 is provided and an edge cleaning member 10a is provided at a distal end of the pen unit 160. As illustrated in FIG. 21, a position of the edge cleaning member 10 with respect to the edge part of the substrate W may move according to the movement of the pen unit 160 (also see the first embodiment).

In a case where the pen unit 160, as described in the present modification, has been employed, the size of an apparatus can be reduced. In addition, an aspect may be employed in which the root of the pen unit 160 is fastened by a fastening member, and the pen unit 160 itself may be exchanged. In a case where such an aspect has been employed, an exchange task can be facilitated, and this can avoid a reduction in an operation rate of the substrate cleaning apparatus. Note that such an aspect does not always need to be employed, and the edge cleaning member 10a that is located at the distal end of the pen unit 160 may be exchangeable.

In the aspect illustrated in FIGS. 20A and 20B, an aspect is employed in which the edge rotating part 40 and the edge rotary shaft 19 are coupled via gear members 146 to 149. A rotary shaft that is coupled to the edge rotary shaft 19, the gear member 147, and the gear member 148 is rotatably supported by a pedestal 145b via each bearing (a reference sign is omitted). In addition, the edge rotating part 40 (a driving motor) supports the pedestal 145b. A driving cover member 145a (see a part rendered with an alternating long and short dashed line in FIG. 20B) that covers the edge rotary shaft 19 and the gear members 146 to 149 but does not cover the edge rotary shaft 19 and the edge cleaning member 10a may be provided. In this case, the edge rotary shaft 19 (in the drawing, a right-hand portion) and the edge cleaning member 10a are provided outside the driving cover member 145a, and the edge rotary shaft 19 (in the drawing, a left-hand portion) and the gear members 146 to 149 are housed in the driving cover member 145a, and fail to be visibly recognized from the outside.

As illustrated in FIGS. 20A and 20B, the edge cleaning member 10a may have a tapered shape in which a distal end is reduced in width. In this case, positioning may be performed in such a way that the substrate W abuts onto the edge cleaning member 10a along a tapered shape portion of the edge cleaning member 10a (see FIGS. 20A and 20B). An aspect in which an edge cleaning member has a tapered shape, as described above, can also be employed in the respective embodiments and modifications described above. In this case, similarly, positioning may be performed in such a way that the substrate W abuts onto the edge cleaning member 10 along a tapered shape portion of the edge cleaning member 10.

In addition, in the aspect illustrated in FIGS. 20A and 20B, a cantilever configuration is employed in which only the root of the pen unit 160 is held, and such a cantilever configuration may also be employed in the respective embodiments and modifications described above.

As described above, the pen unit 160, as described in the present modification, can be employed in all of the configurations employed in the respect embodiments described above.

Modification 3

Figure 22A:
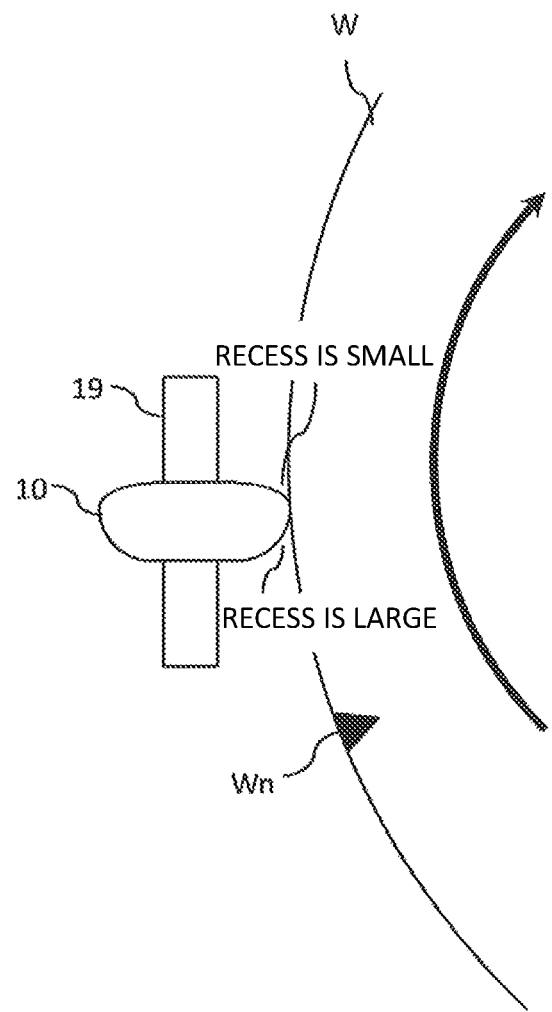
FIG. 22A is a plan view illustrating an edge cleaning member that can be used in Modification 3 of the present invention.

As illustrated in FIG. 22A, an aspect may be employed in which a portion on an upstream side of the rotation direction of the substrate W has a recess that is larger than a recess of a portion on a downstream side of the rotation direction in a case where the edge cleaning member 10 is viewed in a normal direction of the substrate W (for example, in a case where the edge cleaning member 10 is viewed from the above). When description is provided by using the aspect illustrated in FIGS. 22A and 22B, an aspect is employed in which a portion on an upstream side of a rotation direction of the substrate W, the portion being located on lower sides in FIGS. 22A and 22B, has a recess that is larger than a recess of a portion on a downstream side of the rotation direction, the portion being located on upper sides in FIGS. 22A and 22B, in a case where the edge cleaning member 10 is viewed in the normal direction of the substrate W.

Figure 22B:
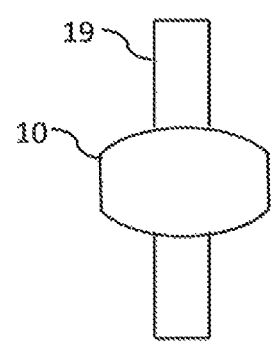
FIG. 22B is a plan view illustrating an edge cleaning member in another aspect that can be used in Modification 3.

In a case where the substrate W is made of a wafer, a notch Wn is provided in the substrate W in some cases. In a case where the present aspect has been employed, a probability that the edge cleaning member 10 will be caught on the notch Wn can be reduce, while the area of cleaning performed by the edge cleaning member 10 is secured to a certain degree. In addition, an edge cleaning member 10 having a barrel shape, as illustrated in FIG. 22B, may be employed. In this case, similarly, a probability that the edge cleaning member 10 will be caught on the notch Wn can be reduced.

The description of each embodiments, each modification and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

10 Edge cleaning member
11 First edge cleaning member
12 Second edge cleaning member
13 Third edge cleaning member
14 Fourth edge cleaning member
15 Fifth edge cleaning member
19 Edge rotary shaft
21 Detecting part
31 First moving part
36 Second moving part
40 Edge rotating part
50 Apparatus control part (control part)
60 Edge cleaning liquid supplying part
70 Cover member
71 Bulkhead
75 Attachment part
79 Discharge outlet
81 Contact member
82 Cleaning liquid supplying member
83 Suction member
110 Substrate rotating part
130 Substrate rotary shaft
160 Pen unit
210 Substrate cleaning member
W Substrate
W1 One-side edge area
W2 Another-side edge area
W3 Side face area

What is claimed is:

1. A substrate cleaning apparatus comprising:
a substrate rotating part that rotates a substrate;
an edge cleaning member for cleaning an edge part of the substrate;
an edge rotating part that rotates the edge cleaning member around an edge rotary shaft that extends in a direction orthogonal to a substrate rotary shaft;
a moving part that moves a position of the edge cleaning member with respect to the edge part of the substrate; and
a control part that controls the moving part to move the position of the edge cleaning member with respect to the edge part of the substrate, and causes the edge cleaning member to clean a one-side edge area including a face on one side, a side face area including a side face, and an another-side edge area including a face on another side in the edge part of the substrate, wherein the control part controls in such a way that the edge cleaning member cleans the one-side edge area during a predetermined time period, then the edge cleaning member cleans the side face area during a predetermined time period, and then the edge cleaning member cleans the another-side edge area during a predetermined time period; or the control part controls in such a way that the edge cleaning member cleans the another-side edge area during a predetermined time period, then the edge cleaning member cleans the side face area during a predetermined time period, and then the edge cleaning member cleans the one-side edge area during a predetermined time period.

2. The substrate cleaning apparatus, according to claim 1, further comprising a detecting part that detects a force applied to the edge cleaning member, wherein
the control part controls the moving part based on a detection result by the detecting part in such a way that a force to be applied to the edge cleaning member at a time when the edge cleaning member cleans the one-side edge area or the another-side edge area is different from a force to be applied to the edge cleaning member at a time when the edge cleaning member cleans the side face area.

3. The substrate cleaning apparatus according to claim 2, wherein
the control part controls in such a way that the force to be applied to the edge cleaning member at the time when the edge cleaning member cleans the one-side edge area is substantially the same as the force to be applied to the edge cleaning member at the time when the edge cleaning member cleans the another-side edge area.

4. The substrate cleaning apparatus according to claim 2, wherein
the control part controls in such a way that the force to be applied to the edge cleaning member at the time when the edge cleaning member cleans the one-side edge area and the force to be applied to the edge cleaning member at the time when the edge cleaning member cleans the another-side edge area are greater than the force to be applied to the edge cleaning member at the time when the edge cleaning member cleans the side face area.

5. The substrate cleaning apparatus according to claim 1, further comprising:
a substrate cleaning liquid supplying part that supplies cleaning liquid to the substrate;
wherein
the control part controls the moving part to separate the edge cleaning member from the edge part of the substrate, and then stop a rotation of the substrate by the substrate rotating part.

6. The substrate cleaning apparatus according to claim 5, wherein
the control part controls to stop a supply of cleaning liquid from the substrate cleaning liquid supplying part after the edge cleaning member is separated from the edge part of the substrate and before the rotation of the substrate by the substrate rotating part is stopped.

7. The substrate cleaning apparatus according to claim 5, wherein
the control part controls to stop the rotation of the edge cleaning member by the edge rotating part before the edge cleaning member is separated from the edge part of the substrate.

8. The substrate cleaning apparatus according to claim 1, wherein
the substrate is a wafer, and
the edge cleaning member has a shape in which a side face is curved in accordance with a shape of the wafer.

9. The substrate cleaning apparatus, according to claim 1, further comprising an edge cleaning liquid supplying part that supplies cleaning liquid to a contact portion between the edge cleaning member and the substrate in a direction toward the edge part from a center part of the substrate.

10. The substrate cleaning apparatus according to claim 1, wherein
a bulkhead is provided on a center side of the substrate with respect to the edge cleaning member.

11. The substrate cleaning apparatus, according to claim 10, further comprising a cover member having the bulkhead, wherein
the cover member covers the edge cleaning member.

12. The substrate cleaning apparatus, according to claim 11, further comprising an edge cleaning liquid supplying part that supplies cleaning liquid to a contact portion between the edge cleaning member and the substrate in a direction toward the edge part from a center part of the substrate, wherein
an attachment part is used to attach the edge cleaning liquid supplying part to the cover member.

13. The substrate cleaning apparatus, according to claim 11, further comprising an edge cleaning liquid supplying part that supplies cleaning liquid to a contact portion between the edge cleaning member and the substrate in a direction toward the edge part from a center part of the substrate, wherein
a discharge outlet that discharges cleaning liquid supplied from the edge cleaning liquid supplying part is provided at the cover member.

14. The substrate cleaning apparatus, according to claim 1, further comprising an edge cleaning mechanism that cleans the edge cleaning member.

15. The substrate cleaning apparatus according to claim 14, wherein
the edge cleaning mechanism has any one of a contact member that can abut onto the edge cleaning member, a cleaning liquid supplying member that supplies cleaning liquid to the edge cleaning member, and a suction member that sucks the edge cleaning member.

16. The substrate cleaning apparatus according to claim 14, wherein
the control part controls in such a way that the edge cleaning mechanism cleans the edge cleaning member during a time period in which the edge cleaning member does not clean the edge part of the substrate.

17. The substrate cleaning apparatus according to claim 14, wherein
the control part controls in such a way that the edge cleaning member cleans the edge part of the substrate at least partially overlaps a time period during which the edge cleaning mechanism cleans the edge cleaning member.

18. The substrate cleaning apparatus, according to claim 1, comprising a substrate cleaning member that abuts onto and cleans a face on one side or a face on another side of the substrate, wherein
the control part controls in such a way that a time period during which the substrate cleaning member cleans the face on the one side or the face on the another side of the substrate at least partially overlaps a time period during which the edge cleaning member cleans the edge part of the substrate.

* * * * *